US009231111B2

(12) United States Patent
Yamazaki et al.

(10) Patent No.: US 9,231,111 B2
(45) Date of Patent: Jan. 5, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hideomi Suzawa, Atsugi (JP); Akihisa Shimomura, Atsugi (JP); Tetsuhiro Tanaka, Isehara (JP); Sachiaki Tezuka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 32 days.

(21) Appl. No.: 14/174,477

(22) Filed: Feb. 6, 2014

(65) Prior Publication Data

US 2014/0225104 A1    Aug. 14, 2014

(30) Foreign Application Priority Data

Feb. 13, 2013   (JP) .................................. 2013-025088

(51) Int. Cl.
*H01L 29/786* (2006.01)
*H01L 29/423* (2006.01)
*H01L 29/49* (2006.01)

(52) U.S. Cl.
CPC ...... *H01L 29/7869* (2013.01); *H01L 29/42384* (2013.01); *H01L 29/4908* (2013.01); *H01L 29/78606* (2013.01); *H01L 29/78696* (2013.01)

(58) Field of Classification Search
CPC .................... H01L 29/7869; H01L 29/42384; H01L 29/4908; H01L 29/78606; H01L 29/78696
See application file for complete search history.

(56) References Cited

U.S. PATENT DOCUMENTS

| 1,900,018 | A | * | 3/1933 | Lilienfeld ..................... 330/309 |
| 5,731,856 | A |   | 3/1998 | Kim et al. |
| 5,744,864 | A |   | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology 2003, vol. 26, pp. 181-184.

(Continued)

*Primary Examiner* — Michael Shingleton
(74) *Attorney, Agent, or Firm* — Robinson Intellectual Property Law Office; Eric J. Robinson

(57) ABSTRACT

An object is to provide a semiconductor device that includes an oxide semiconductor and is suitable for a power device. An object is to provide a semiconductor device in which large current can flow. An object is to provide a highly reliable semiconductor device. A semiconductor device includes an oxide stack in which a first oxide layer, a first oxide semiconductor layer, a second oxide semiconductor layer, and a second oxide layer are stacked and has a structure in which a region that contains an element imparting conductivity and is provided in the first oxide semiconductor layer overlaps an electrode functioning as a source electrode and does not overlap an electrode functioning as a drain electrode.

14 Claims, 22 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,709,907 B1* | 3/2004 | Yamazaki et al. ............ 438/163 |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,344,788 B2 | 1/2013 | Yamazaki et al. |
| 8,421,083 B2 | 4/2013 | Yamazaki et al. |
| 8,629,434 B2 | 1/2014 | Arai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0057424 A1* | 3/2003 | Yudasaka et al. ............... 257/87 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0001111 A1* | 1/2006 | Tsuchiya et al. .............. 257/410 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0228457 A1* | 10/2007 | Mori ............................ 257/324 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224873 A1* | 9/2010 | Sakata et al. ..................... 257/43 |
| 2010/0244017 A1* | 9/2010 | Hoffman et al. ................ 257/43 |
| 2010/0314618 A1* | 12/2010 | Tanaka et al. ................... 257/43 |
| 2010/0320458 A1 | 12/2010 | Umeda et al. |
| 2010/0320459 A1 | 12/2010 | Umeda et al. |
| 2011/0042745 A1* | 2/2011 | Negoro ........................... 257/348 |
| 2011/0068852 A1 | 3/2011 | Yamazaki et al. |
| 2011/0193083 A1 | 8/2011 | Kim et al. |
| 2011/0215328 A1 | 9/2011 | Morosawa et al. |
| 2012/0012840 A1* | 1/2012 | Korthuis et al. ................. 257/43 |
| 2012/0056180 A1* | 3/2012 | Chen ................................. 257/57 |
| 2012/0119205 A1 | 5/2012 | Taniguchi et al. |
| 2012/0161121 A1* | 6/2012 | Yamazaki ........................ 257/43 |
| 2012/0164801 A1* | 6/2012 | Yamazaki et al. ............. 438/151 |
| 2012/0228605 A1* | 9/2012 | Noda ................................ 257/43 |
| 2012/0228606 A1* | 9/2012 | Koezuka et al. ................. 257/43 |
| 2012/0289005 A1* | 11/2012 | Tanaka et al. .................. 438/158 |
| 2012/0299006 A1* | 11/2012 | Miyairi et al. .................... 257/71 |
| 2012/0305913 A1 | 12/2012 | Yamazaki et al. |
| 2013/0009209 A1 | 1/2013 | Yamazaki |
| 2013/0009219 A1 | 1/2013 | Yamazaki et al. |
| 2013/0009220 A1 | 1/2013 | Yamazaki et al. |
| 2013/0048996 A1* | 2/2013 | Noda et al. ........................ 257/59 |
| 2013/0078762 A1 | 3/2013 | Akimoto et al. |
| 2013/0082255 A1 | 4/2013 | Akimoto et al. |
| 2013/0087785 A1 | 4/2013 | Akimoto et al. |
| 2013/0089950 A1 | 4/2013 | Akimoto et al. |
| 2013/0119378 A1 | 5/2013 | Yamazaki et al. |
| 2013/0161608 A1 | 6/2013 | Yamazaki |
| 2013/0161611 A1 | 6/2013 | Yamazaki et al. |
| 2013/0200365 A1 | 8/2013 | Yamazaki |
| 2013/0228777 A1 | 9/2013 | Yamazaki et al. |
| 2013/0270552 A1 | 10/2013 | Yamazaki et al. |
| 2013/0320330 A1 | 12/2013 | Yamazaki |
| 2013/0320334 A1 | 12/2013 | Yamazaki et al. |
| 2013/0320337 A1 | 12/2013 | Yamazaki et al. |
| 2013/0328045 A1* | 12/2013 | Takata et al. ..................... 257/43 |
| 2013/0334523 A1 | 12/2013 | Yamazaki |
| 2013/0334533 A1* | 12/2013 | Yamazaki ........................ 257/57 |
| 2014/0001465 A1* | 1/2014 | Yamazaki ........................ 257/43 |
| 2014/0004656 A1 | 1/2014 | Sasagawa et al. |
| 2014/0103332 A1* | 4/2014 | Ahn et al. ........................ 257/43 |

(56) References Cited

U.S. PATENT DOCUMENTS

| | | | |
|---|---|---|---|
| 2014/0239293 A1 | 8/2014 | Yamazaki et al. | |
| 2014/0239294 A1 | 8/2014 | Yamazaki | |
| 2015/0011046 A1* | 1/2015 | Tanaka et al. | 438/104 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-091382 | 5/2011 |
| JP | 2011-172217 | 9/2011 |
| JP | 2012-160679 A | 8/2012 |
| WO | WO-2004/114391 | 12/2004 |
| WO | WO-2008/133345 | 11/2008 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m= 3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducitng Oxdes", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physcs), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4306.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09: SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 28, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT"SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

* cited by examiner

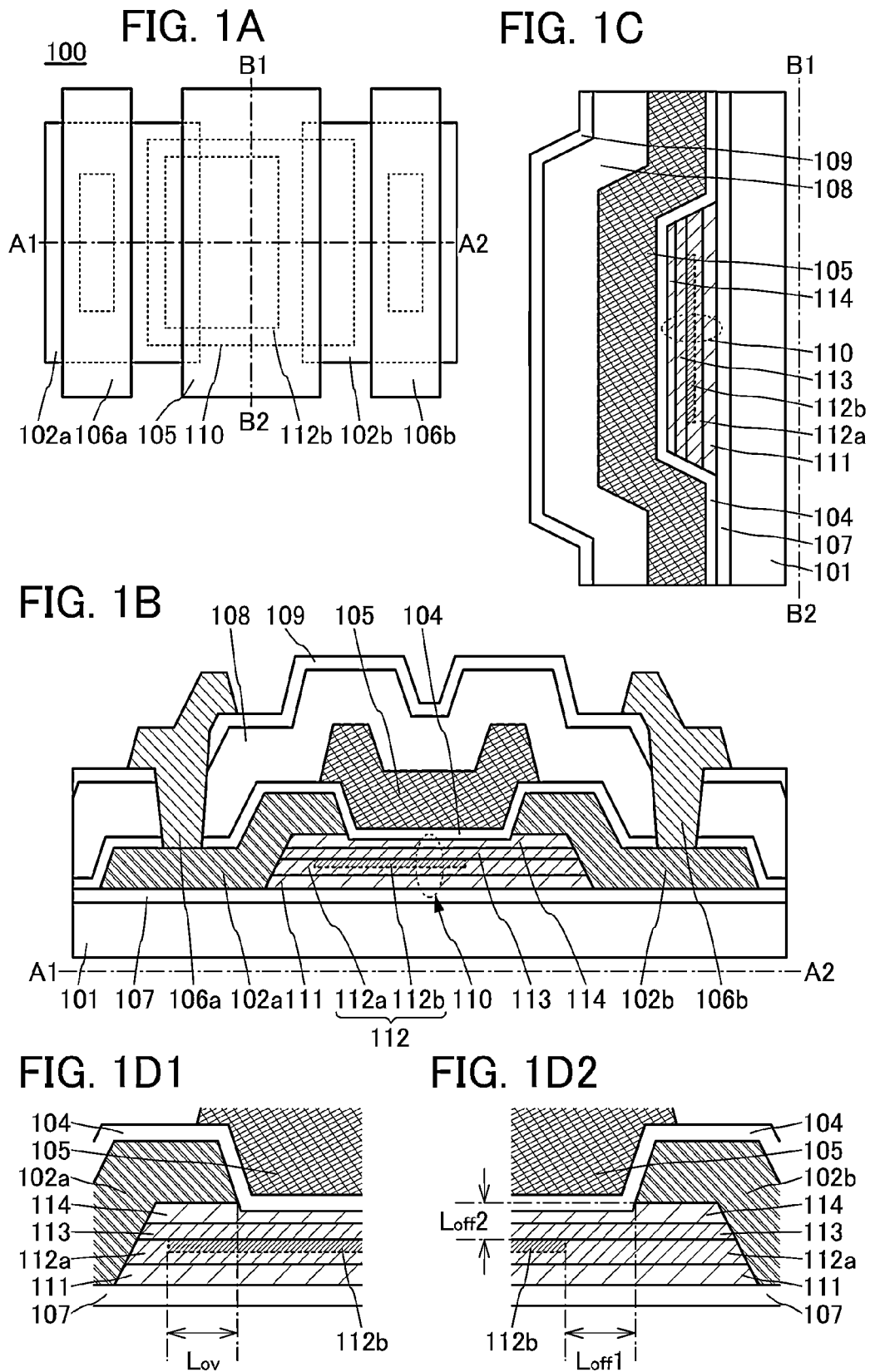

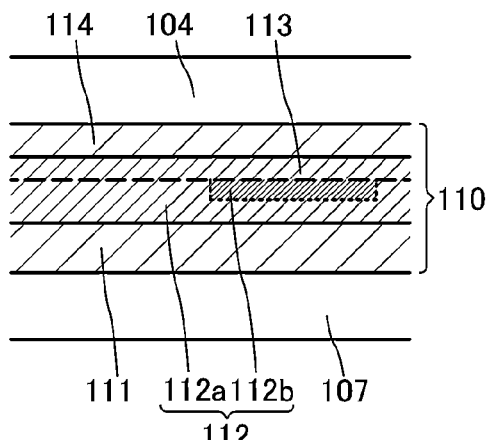
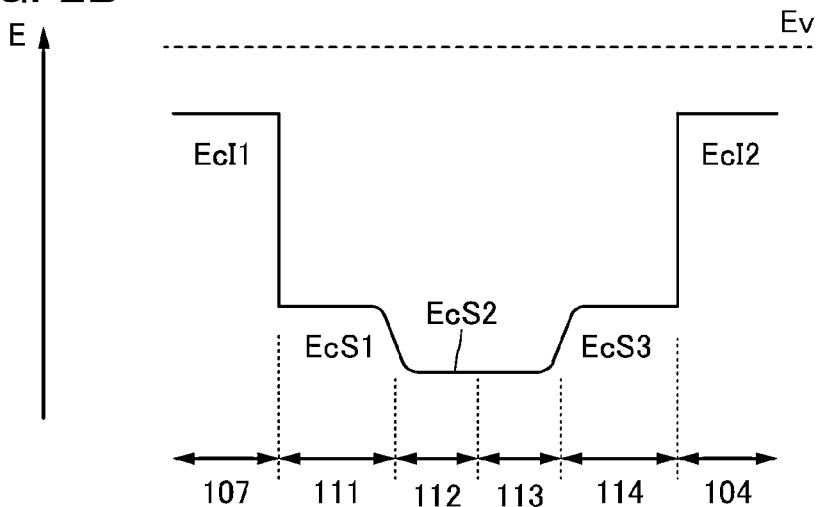
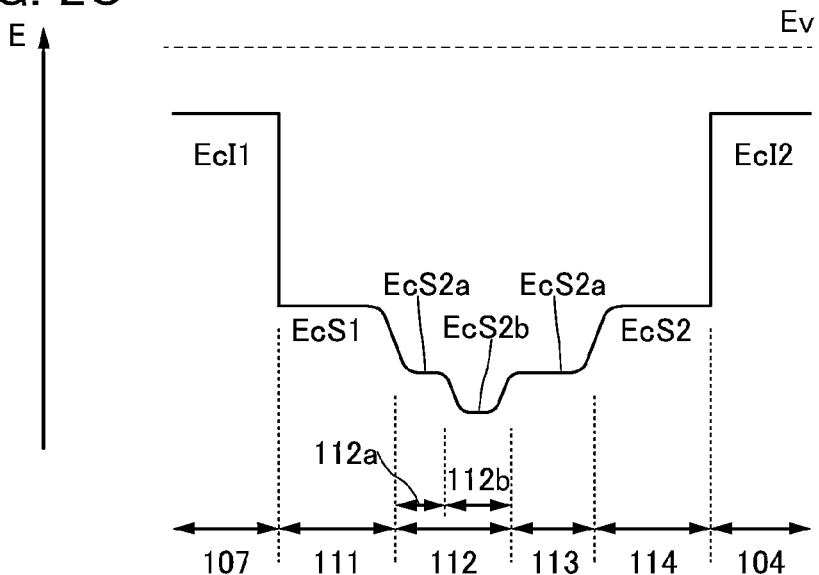

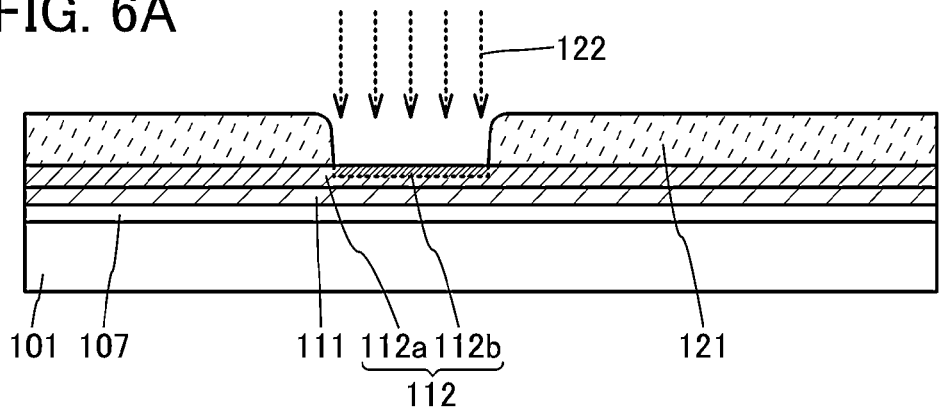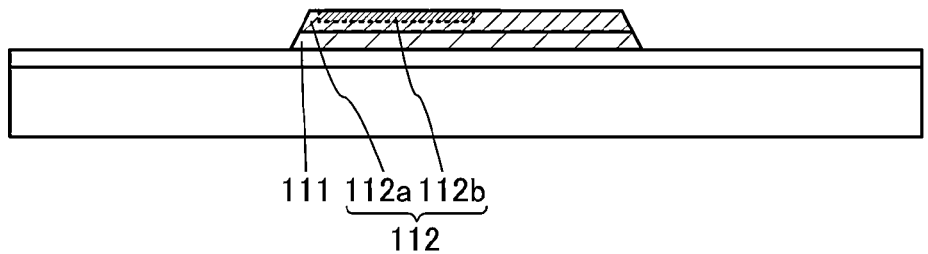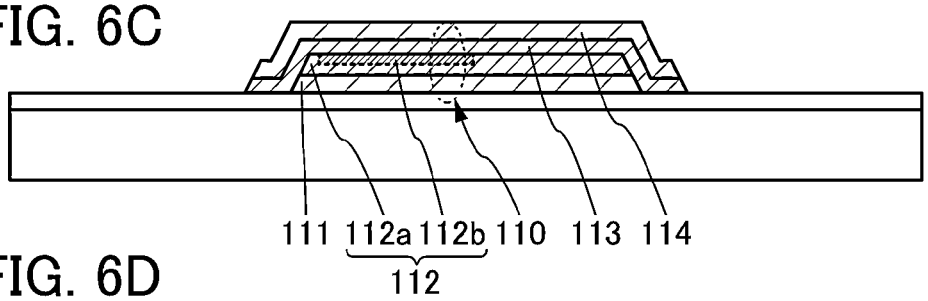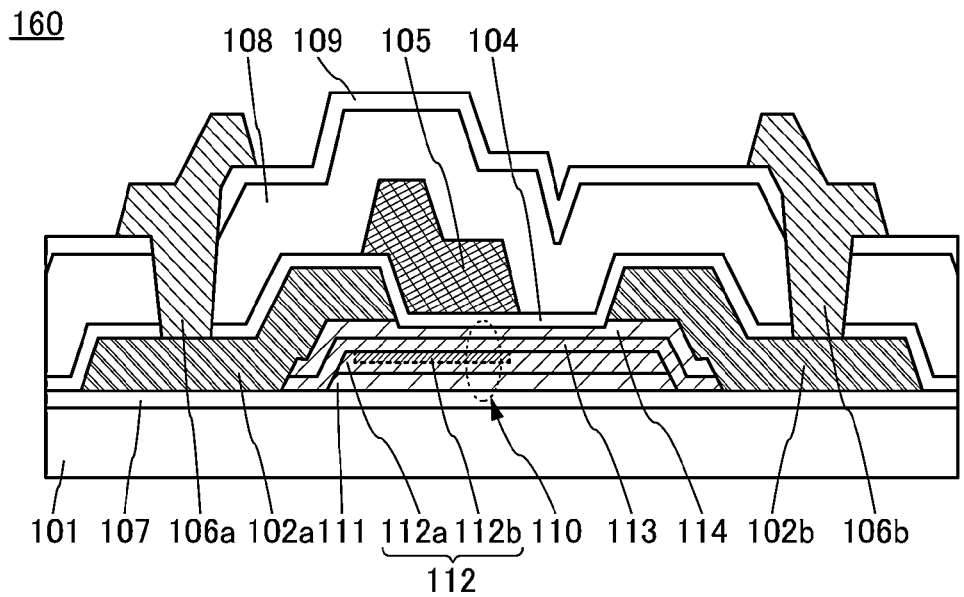

CAAC-OS nc-OS as-sputtered

After 450°C
Heat Treatment

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example.

In this specification, a semiconductor device generally means a device which can function by utilizing semiconductor characteristics. For example, a semiconductor element such as a transistor; a power device; an integrated circuit, a power supply circuit, or a power supply converter circuit each including a power device; an electro-optical device; a semiconductor circuit; and an electronic appliance may be included in a semiconductor device or may include a semiconductor device.

2. Description of the Related Art

As a semiconductor device used for a power device, a power device manufactured with the use of silicon is widely prevalent. However, the performance of a power device including silicon is reaching its limit, and it is becoming difficult to achieve higher performance.

In the case where silicon is used for a power device, there is a limitation on operation at a high temperature because the band gap of silicon is small. Thus, in recent years, a power device including SiC or GaN, which has a wide band gap, has been developed.

The use of an oxide semiconductor in a semiconductor device which is used as a power device for a high-power application is disclosed (see Patent Documents 1 and 2).

REFERENCE

Patent Document

[Patent Document 1] Japanese Published Patent Application No. 2011-91382
[Patent Document 2] Japanese Published Patent Application No. 2011-172217

SUMMARY OF THE INVENTION

It is preferable that a transistor used for a power device for large power have a high drain current.

An object of one embodiment of the present invention is to provide a semiconductor device or the like including an oxide semiconductor and suitable for a power device. Another object is to provide a semiconductor device or the like in which large current can flow. Another object of the present invention is to provide a highly reliable semiconductor device or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an oxide stack having a stacked-layer structure in which a first oxide layer, a first oxide semiconductor layer, a second oxide semiconductor layer, and a second oxide layer are stacked sequentially over an insulating surface; a first electrode and a second electrode that are in contact with part of the second oxide layer and separated from each other over the first oxide semiconductor layer; a gate insulating layer over the second oxide layer; and a gate electrode over the gate insulating layer to overlap the oxide stack. The first oxide semiconductor layer includes a first region and a second region; a side portion and a bottom portion of the second region are surrounded by the first region, a top portion of the second region is in contact with the second oxide semiconductor layer; the second region and the first electrode overlap each other and the second region and the second electrode do not overlap each other; and the second region has a higher concentration of an element imparting conductivity to an oxide semiconductor than the first region.

Another embodiment of the present invention is a semiconductor device including an oxide stack having a stacked-layer structure in which a first oxide layer, a first oxide semiconductor layer, a second oxide semiconductor layer, and a second oxide layer are stacked sequentially over an insulating surface; a first electrode and a second electrode that are in contact with part of a top surface of the second oxide semiconductor layer and part of a bottom surface of the second oxide layer, and separated from each other over the first oxide semiconductor layer; a gate insulating layer over the second oxide layer; and a gate electrode over the gate insulating layer to overlap the oxide stack. The first oxide semiconductor layer includes a first region and a second region; a side portion and a bottom portion of the second region are surrounded by the first region, a top portion of the second region is in contact with the second oxide semiconductor layer; the second region and the first electrode overlap each other and the second region and the second electrode do not overlap each other; and the second region has a higher concentration of an element imparting conductivity to an oxide semiconductor than the first region.

The element imparting conductivity to an oxide semiconductor is preferably any of phosphorus, arsenic, antimony, boron, aluminum, nitrogen, argon, helium, neon, indium, fluorine, chlorine, hydrogen, titanium, and zinc.

It is preferable that the first oxide layer, the second oxide layer, the first oxide semiconductor layer, and the second oxide semiconductor layer be each an In-M-Zn oxide (M is one of Al, Ti, Ga, Y, Zr, La, Ce, Nd, and Hf), the first oxide layer have a higher content of the element M than the first oxide semiconductor layer, and the second oxide layer have a higher content of the element M than the second oxide semiconductor layer.

The gate electrode preferably overlaps the first electrode and does not overlap the second electrode. The gate electrode preferably extends to be closer to the second electrode than the second region is.

The thickness of the second oxide semiconductor layer in a region that the first electrode overlaps is preferably greater than or equal to 10 nm and less than or equal to 40 nm.

At least one of the first oxide semiconductor layer and the second oxide semiconductor layer preferably includes a crystal part.

According to the present invention, a semiconductor device that includes an oxide semiconductor and is suitable for a power device can be provided. Further, a semiconductor device in which large current can flow can be provided. Furthermore, a highly reliable semiconductor device can be provided.

BRIEF DESCRIPTION OF THE DRAWINGS

FIGS. 1A to 1D2 illustrate a structural example of a semiconductor device of an embodiment.

FIGS. 2A to 2C are a structural example and band diagrams of an oxide stack of an embodiment.

FIGS. 6A to 6D illustrate an example of a method for manufacturing the semiconductor device of the embodiment.

DETAILED DESCRIPTION OF THE INVENTION

Figure 3A:
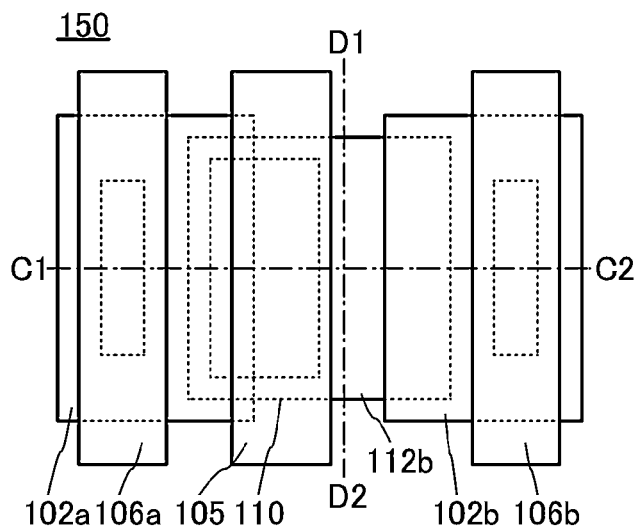
FIGS. 3A to 3C illustrate a structural example of a semiconductor device of an embodiment of the present invention.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of flow of current is changed in circuit operation, for example. Therefore, the terms "source" and "drain" can be used to denote the drain and the source, respectively, in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, a coil, a capacitor, and an element with a variety of functions in addition to an electrode and a wiring.

Embodiment 1

In this embodiment, a structural example of a semiconductor device of one embodiment of the present invention is described with reference to drawings. A transistor is described as an example of the semiconductor device.

Structural Example 1

Structure Example of Transistor

FIGS. 1A to 1D2 illustrate a transistor 100 that is an example described in this structural example. FIG. 1A is a schematic top view of the transistor 100. FIGS. 1B and 1C are schematic cross-sectional views taken along lines A1-A2 and B1-B2 in FIG. 1A, respectively. Note that FIG. 1A illustrates only main components for simplicity.

The structure illustrated in FIGS. 1A to 1D2 includes an oxide stack 110 which is provided over an insulating layer 107 provided over a substrate 101. The oxide stack 110 has a stacked-layer structure in which a first oxide layer 111, a first oxide semiconductor layer 112, a second oxide semiconductor layer 113, and a second oxide layer 114 are stacked in this order. A first electrode 102a and a second electrode 102b which are apart from each other are provided over the oxide stack 110 to be in contact with a top surface of the second oxide layer 114. A gate insulating layer 104 which covers exposed surfaces of the first electrode 102a, the second electrode 102b, and the second oxide layer 114 is provided. A gate electrode 105 is provided over the gate insulating layer 104 to overlap the oxide stack 110.

An insulating layer 108 is provided to cover the gate insulating layer 104 and the gate electrode 105. An insulating layer 109 is provided over the insulating layer 108. Further, over the insulating layer 109, an electrode 106a and an electrode 106b which are electrically connected to the first electrode 102a and the second electrode 102b, respectively, are provided in opening portions formed in the insulating layer 109, the insulating layer 108, and the gate insulating layer 104.

The first electrode 102a functions as a source electrode of the transistor 100. The second electrode 102b functions as a drain electrode of the transistor 100.

The oxide stack 110 has the stacked-layer structure in which the first oxide layer 111, the first oxide semiconductor layer 112, the second oxide semiconductor layer 113, and the second oxide layer 114 are sequentially stacked from the substrate 101 side. Here, a channel is mainly formed in the first oxide semiconductor layer 112 and the second oxide semiconductor layer 113 of the layers included in the oxide stack 110. In other words, the transistor 100 has a buried channel structure.

The second oxide layer 114 may function as a gate insulating layer.

The first oxide semiconductor layer 112 includes a second region 112b which contains an element that imparts conductivity to an oxide semiconductor included in the first oxide semiconductor layer 112, and a first region 112a which has a lower concentration of the element than the second region 112b. An example of the element is phosphorus.

In addition, examples of the element imparting conductivity to the oxide semiconductor include elements belonging to Group 15 (e.g., arsenic (As) and antimony (Sb)), boron (B), aluminum (Al), nitrogen (N), argon (Ar), helium (He), neon (Ne), indium (In), fluorine (F), chlorine (Cl), hydrogen (H), titanium (Ti), and zinc (Zn).

When the second region 112b containing the element is provided in the first oxide semiconductor layer 112, the series resistance between a source and a drain of the transistor 100 in an on state can be reduced. As a result, current flowing between the source and the drain in the on state (the current is also referred to as on-state current) can be increased.

The second region 112b is provided on the inside of end portions of the first oxide semiconductor layer 112. Further, the second region 112b is provided in the first oxide semiconductor layer 112 so that the bottom and side portions of the second region 112b are surrounded by the first region 112a. The second oxide semiconductor layer 113 is provided over the second region 112b.

Since the second region 112b is provided to be surrounded by the first region 112a of the first oxide semiconductor layer 112 and the second oxide semiconductor layer 113 in the above manner, the second region 112b is not in direct contact with the first electrode 102a and the second electrode 102b. Therefore, the on-state current of the transistor 100 can be increased while leakage current between the source and the drain of the transistor 100 in an off state (the current is also referred to as off-state current) can be reduced.

FIG. 1D1 is an enlarged schematic cross-sectional view of part of the oxide stack 110 in the vicinity of the first electrode 102a in the transistor 100, and FIG. 1D2 is an enlarged schematic cross-sectional view of part of the oxide stack 110 in the vicinity of the second electrode 102b in the transistor 100.

As illustrated in FIGS. 1D1 and 1D2, the second region 112b and the first electrode 102a functioning as the source electrode overlap each other and the second region 112b and the second electrode 102b functioning as the drain electrode do not overlap each other.

The first electrode 102a functioning as the source electrode and the second region 112b overlap each other as illustrated in FIG. 1D1, whereby carriers are easily supplied from the first electrode 102a, through the second oxide layer 114 and the second oxide semiconductor layer 113, to the second region 112b. As a result, the on-state current can be increased.

As illustrated in FIG. 1D1, the length of a portion where the first electrode 102a and the second region 112b overlap each other in the channel length direction (the direction parallel to the direction of the flowing current) is denoted by $L_{ov}$. The $L_{ov}$ is preferably set long because the long $L_{ov}$ can facilitate supply of carriers from the first electrode 102a to the second region 112b.

As illustrated in FIG. 1D1, the second oxide semiconductor layer 113 and the second oxide layer 114 are provided between the second region 112b and the first electrode 102a. With such a structure, the second region 112b and the first electrode 102a are not in contact with each other; therefore, on/off operation of the transistor 100 can be secured, and further, the normally-off transistor 100 can be obtained.

To obtain a sufficient distance between the first electrode 102a and the second region 112b so that the first electrode 102a and the second region 112b are not in contact with each other, the thickness of the second oxide semiconductor layer 113 is preferably adjusted. For example, when the thickness of the second oxide semiconductor layer 113 in a region which the first electrode 102a overlaps is greater than or equal to 10 nm and less than or equal to 40 nm, preferably greater than or equal to 20 nm and less than or equal to 40 nm, the on/off operation of the transistor 100 can be secured without sacrifice of on-state current and the normally off transistor 100 can be obtained.

On the other hand, as illustrated in FIG. 1D2, since the second electrode 102b functioning as the drain electrode and the second region 112b are provided not to overlap each other, electric field concentration at the end of the channel on the drain side is relieved, so that degradation of the characteristics of the transistor 100 can be inhibited.

As illustrated in FIG. 1D2, the shortest length between edges portions of the second electrode 102b and the second region 112b in the channel length direction is denoted by $L_{off}1$. Further, a difference in height between a plane of the second electrode 102b in contact with the oxide stack 110 and the top surface of the second region 112b is denoted by $L_{off}2$. Here, the $L_{off}2$ can be controlled by the thickness of the second oxide semiconductor layer 113 and the thickness of the second oxide layer 114.

Depending on the carrier concentration of the second region 112b, the off-state current of the transistor 100 might be increased when the second electrode 102b and the second region 112b overlap each other or when the $L_{off}1$ is short. Therefore, the $L_{off}1$ is preferably set long. However, even when the $L_{off}1$ is short, setting the $L_{off}2$ long enables a reduction in the off-state current of the transistor 100 without an increase in the distance between the first electrode 102a and the second electrode 102b. The $L_{off}1$ and the $L_{off}2$ are adjusted in the above manner, whereby the off-state current of the transistor can be reduced while the on-state current of the transistor can be increased.

Note that a conductive material which is easily bonded to oxygen is preferably used for the first electrode 102a and the second electrode 102b. For example, Al, Cr, Cu, Ta, Ti, Mo, or W can be used. W or Ti with a relatively high melting point is preferably used, which allows subsequent process temperatures to be relatively high. Note that the conductive material which is easily bonded to oxygen includes, in its category, a material to which oxygen is easily diffused.

When such a conductive material that is easily bonded to oxygen is in contact with the oxide stack 110, part of oxygen in the oxide stack 110 is taken into the conductive material. There are some heating steps in a manufacturing process of the transistor, and thus the above transfer of oxygen causes generation of oxygen vacancy in a region of the oxide stack 110 which is in the vicinity of an interface between the oxide stack 110 and the first electrode 102a or the second electrode 102b, so that an n-type region (also referred to as a low-resistance region) is formed. The low-resistance region can serve as a source or a drain of the transistor 100.

In the above manner, the low-resistance region is formed in the region of the oxide stack 110 in contact with the first electrode 102a or the second electrode 102b, whereby contact resistance between the oxide stack 110 and the first electrode 102a or the second electrode 102b is reduced, so that parasitic resistance between the source and the drain in the transistor 100 can be reduced. As a result, the on-state current of the transistor can be increased.

Here, an oxide semiconductor film which contains oxygen sufficiently and is highly purified has a band gap of about 2.8 eV to 3.2 eV and has extremely few minority carriers having a density of about $1 \times 10^{-9}/cm^3$. Majority carriers come only from a source of the transistor. Therefore, avalanche breakdown does not occur in the transistor including the oxide semiconductor film.

Therefore, even when driving is performed at a high voltage such as several tens volts or several hundred volts, the channel width can be extremely long as compared to the channel length in the transistor. As a result, the on-state current of the transistor can be increased. For example, even when the ratio of the channel width to the channel length (W/L) is greater than or equal to $10^3$, greater than or equal to $10^4$, or further, greater than or equal to $10^5$, favorable on/off operation can be achieved. For example, in the case of driving at a voltage less than or equal to 30 V, when the channel length is 3 μm, the channel width may fall within the range of 1 cm to 10 m, and for example, may be 80 cm.

Further, since an oxide semiconductor has a large band gap, the electrical characteristics of a transistor including an oxide semiconductor can have extremely small temperature dependence. For example, it is possible to obtain a transistor that has favorable temperature dependence of the threshold voltage, on-state current, or off-state current as compared to a transistor using silicon as a semiconductor. Therefore, the transistor including an oxide semiconductor is suitable for high temperature operation.

[Oxide Stack]

The stacked-layer structure included in one embodiment of the present invention is described below.

Structural Example

A stacked-layer structure illustrated in FIG. 2A includes the oxide stack 110 between the insulating layer 107 and the gate insulating layer 104. The oxide stack 110 includes the first oxide layer 111, the first oxide semiconductor layer 112, the second oxide semiconductor layer 113, and the second oxide layer 114. Note that in the actual cross-sectional structure, the interfaces between the first oxide layer 111 and the first oxide semiconductor layer 112, between the first oxide semiconductor layer 112 and the second oxide semiconductor layer 113, and between the second oxide semiconductor layer 113 and the second oxide layer 114 are often not clear. In particular, when the composition of the first oxide semiconductor layer 112 is the same as or close to that of the second oxide semiconductor layer 113, the interface therebetween is mostly not clear. Therefore, the interface is denoted by a dashed line in FIG. 2A.

The first oxide layer 111 and the second oxide layer 114 are each an oxide that contains one or more kinds of metal elements forming the first oxide semiconductor layer 112 and the second oxide semiconductor layer 113.

The first oxide semiconductor layer 112 and the second oxide semiconductor layer 113 each include a layer represented as an In-M-Zn oxide, which contains at least indium, zinc, and M (M is a metal such as Al, Ga, Ge, Y, Zr, Sn, La, Ce, or Hf). The first oxide semiconductor layer 112 and the second oxide semiconductor layer 113 preferably include indium, because carrier mobility of the transistor is increased.

The first oxide semiconductor layer 112 and the second oxide semiconductor layer 113 preferably contain the same metal element(s). Further, the composition of the metal elements of the first oxide semiconductor layer 112 is preferably the same as or close to that of the second oxide semiconductor layer 113. When the first oxide semiconductor layer 112 and the second oxide semiconductor layer 113 are made to have the same composition, the energy of the bottom of the conduction band in the first oxide semiconductor layer 112 can be as close to that in the second oxide semiconductor layer 113 as possible. As a result, the current path can be prevented from being formed in only one of the first oxide semiconductor layer 112 and the second oxide semiconductor layer 113, and both of the layers can be used as a main current path. As a result, the series resistance between the source and the drain of the transistor can be reduced.

The first oxide layer 111 under the first oxide semiconductor layer 112 includes an oxide layer which is represented by an In-M-Zn oxide (M is a metal such as Al, Ti, Ga, Ge, Y, Zr, Sn, La, Ce, or Hf) and contains a larger amount of M in an atomic ratio than that in the first oxide semiconductor layer 112. Specifically, the amount of the above element in the first oxide layer 111 in an atomic ratio is 1.5 times or more, preferably twice or more, further preferably 3 times or more as large as that in the first oxide semiconductor layer 112. The above element is more strongly bonded to oxygen than indium, and thus has a function of suppressing generation of oxygen vacancy in the oxide layer. That is, oxygen vacancy is more unlikely to be generated in the first oxide layer 111 than in the first oxide semiconductor layer 112.

The second oxide layer 114 over the second oxide semiconductor layer 113 includes an oxide layer which is represented by an In-M-Zn oxide (M is a metal such as Al, Ti, Ga, Ge, Y, Zr, Sn, La, Ce, or Hf) and contains a larger amount of M in an atomic ratio than that in the second oxide semiconductor layer 113. Specifically, the amount of the above element in the second oxide layer 114 in an atomic ratio is 1.5 times or more, preferably twice or more, further preferably 3 times or more as large as that in the second oxide semiconductor layer 113. The above element is more strongly bonded to oxygen than indium, and thus has a function of suppressing generation of oxygen vacancy in the oxide layer. That is, oxygen vacancy is more unlikely to be generated in the second oxide layer 114 than in the second oxide semiconductor layer 113.

In other words, when each of the first oxide layer 111, the first oxide semiconductor layer 112, the second oxide semiconductor layer 113, and the second oxide layer 114 is an In-M-Zn oxide containing at least indium, zinc, and M (M is a metal such as Al, Ti, Ga, Ge, Y, Zr, Sn, La, Ce, or Hf), the first oxide layer 111 has an atomic ratio of $In:M:Zn=x_1:y_1:z_1$, the first oxide semiconductor layer 112 or the second oxide semiconductor layer 113 has an atomic ratio of $In:M:Zn=x_2:$ $y_2:z_2$, and the second oxide layer 114 has an atomic ratio of In:M:Zn=$x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably twice or more, further preferably 3 times or more as large as $y_2/x_2$. At this time, when $y_2$ is greater than or equal to $x_2$ in the first oxide semiconductor layer 112 and the second oxide semiconductor layer 113, a transistor can have stable electrical characteristics. However, when $y_2$ is 3 times or more as large as $x_2$, the field-effect mobility of the transistor is reduced; accordingly, $y_2$ is preferably less than 3 times $x_2$.

Note that when the first oxide layer 111 is an In-M-Zn oxide layer, the atomic ratio between In and M is preferably as follows: the atomic percentage of In is less than 75 at. % and the atomic percentage of M is greater than or equal to 25 at. %; further preferably, the atomic percentage of In is less than 50 at. % and the atomic percentage of M is greater than or equal to 50 at. %; still further preferably, the atomic percentage of In is less than 25 at. % and the atomic percentage of M is greater than or equal to 75 at. %.

When the first oxide semiconductor layer 112 and the second oxide semiconductor layer 113 are each an In-M-Zn oxide, the atomic ratio between In and M is preferably as follows: the atomic percentage of In is higher than or equal to 25 atomic % and the atomic percentage of M is lower than 75 atomic %; further preferably, the atomic percentage of In is higher than or equal to 34 atomic % and the atomic percentage of M is lower than 66 atomic %.

Note that when the second oxide layer 114 is an In-M-Zn oxide layer, the atomic ratio between In and M is preferably as follows: the atomic percentage of In is less than 75 at. % and the atomic percentage of M is greater than or equal to 25 at. %; further preferably, the atomic percentage of In is less than 50 at. % and the atomic percentage of M is greater than or equal to 50 at. %; still further preferably, the atomic percentage of In is less than 25 at. % and the atomic percentage of M is greater than or equal to 75 at. %.

The constituent elements of the first oxide layer 111 and the second oxide layer 114 may be different from each other, or their constituent elements may be the same at the same atomic ratios or different atomic ratios.

An oxide semiconductor containing, for example, indium, zinc, and gallium can be used for the first oxide layer 111, the first oxide semiconductor layer 112, the second oxide semiconductor layer 113, and the second oxide layer 114.

The thickness of each of the first oxide layer 111, the first oxide semiconductor layer 112, the second oxide semiconductor layer 113, and the second oxide layer 114 may be set as appropriate in accordance with electrical characteristics (e.g., the output voltage) needed for the transistor 100. For example, the thickness of the second oxide layer 114 is greater than or equal to 3 nm and less than or equal to 500 nm, preferably greater than or equal to 3 nm and less than or equal to 100 nm, further preferably greater than or equal to 3 nm and less than or equal to 50 nm. The thickness of each of the first oxide semiconductor layer 112 and the second oxide semiconductor layer 113 is greater than or equal to 3 nm and less than or equal to 500 nm, preferably greater than or equal to 3 nm and less than or equal to 200 nm, further preferably greater than or equal to 3 nm and less than or equal to 100 nm, still further preferably greater than or equal to 3 nm and less than or equal to 50 nm. The thickness of the first oxide layer 111 is preferably greater than or equal to the thickness of each of the second oxide layer 114, the first oxide semiconductor layer 112, and the second oxide semiconductor layer 113.

It is preferable that the first oxide layer 111 contain one or more kinds of metal elements forming the first oxide semiconductor layer 112, and is formed using an oxide semiconductor whose energy of the bottom of the conduction band is closer to the vacuum level than that of the first oxide semiconductor layer 112 by 0.05 eV or more, 0.07 eV or more, 0.1 eV or more, or 0.15 eV or more and 2 eV or less, 1 eV or less, 0.5 eV or less, or 0.4 eV or less.

Similarly, it is preferable that the second oxide layer 114 contain one or more kinds of metal elements forming the second oxide semiconductor layer 113, and is formed using an oxide semiconductor whose energy of the bottom of the conduction band is closer to the vacuum level than that of the second oxide semiconductor layer 113 by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode provided over the gate insulating layer 104 in such a structure, the channel is mainly formed in the first and second oxide semiconductor layers 112 and 113 whose bottoms of the conduction band have the smallest energy among those of the layers in the oxide stack 110. That is, since the second oxide layer 114 is provided between the gate insulating layer 104 and the first and second oxide semiconductor layers 112 and 113, the structure in which the channel of the transistor is not in contact with the gate insulating layer 104 can be obtained.

Note that the second oxide layer 114 may function as a gate insulating layer. In the case where the second oxide layer 114 has a sufficiently large band gap, the second oxide layer 114 does not have the properties of a complete semiconductor but has a properties close to those of an insulator, and thus can function as a gate insulating layer.

In the cross-sectional structure in FIG. 2A, the second region 112b that contains the element imparting conductivity to an oxide semiconductor is provided in the first oxide semiconductor layer 112. The first region 112a that has a lower concentration of the element than the second region 112b is provided in a region that is closer to at least the insulating layer 107 than the second region 112b is. The top surface of the second region 112b is in contact with the second oxide semiconductor layer 113.

Here, the concentration of the element successively changes in the vicinity of the interface between the first region 112a and the second region 112b; therefore, the interface is often not clear. Therefore, the interface between the first region 112a and the second region 112b is denoted by a dotted line in FIG. 2A.

As described above, the second region 112b has the element imparting conductivity to an oxide semiconductor. It is preferable to use phosphorus as the element.

The phosphorus contained in the oxide semiconductor is bonded to oxygen in the oxide semiconductor. As a result, oxygen vacancy is generated in the oxide semiconductor, an impurity state is formed in the band gap, and the impurity state serves as a donor and generates an electron, so that the oxide semiconductor may become n-type. That is, by introducing phosphorus to the oxide semiconductor, the oxide semiconductor can become n-type. Accordingly, the second region 112b can also be referred to as an n-type region.

As the element contained in the second region 112b, in addition to phosphorus (P), elements belonging to Group 15 (e.g., arsenic (As) and antimony (Sb)), boron (B), aluminum (Al), nitrogen (N), argon (Ar), helium (He), neon (Ne), indium (In), fluorine (F), chlorine (Cl), hydrogen (H), titanium (Ti), or zinc (Zn) may be used.

Examples of a method for introducing the element to the first oxide semiconductor layer 112 include an ion implantation method, an ion doping method, and a plasma immersion ion implantation method.

The concentration of the element of the second region 112b is, for example, higher than or equal to $1\times10^{15}$ atoms/cm$^3$ and lower than or equal to $1\times10^{20}$ atoms/cm$^3$, preferably higher than or equal to $1\times10^{15}$ atoms/cm$^3$ and lower than or equal to $1\times10^{18}$ atoms/cm$^3$, further preferably higher than or equal to $1\times10^{16}$ atoms/cm$^3$ and lower than or equal to $1\times10^{18}$ atoms/cm$^3$. The carrier density of the second region 112b is increased with the introduction of the element. When the concentration of the element is low, the effect of increasing the on-state current of the transistor is reduced; when the concentration is too high, deficiency occurs, for example, the switching characteristics of the transistor cannot be obtained (the transistor is not turned off or pinch-off does not occur).

Note that the concentration of the element of the oxide stack 110 can be measured by secondary ion mass spectrometry (SIMS).

The second region 112b may have a concentration gradient in which the concentration of the element successively changes in the thickness direction of the first oxide semiconductor layer 112. In the concentration distribution in the thickness direction of the second region 112b, a region having the highest concentration is preferably located in the first oxide semiconductor layer 112 on the second oxide semiconductor layer 113 side. Alternatively, the element may be diffused from the first oxide semiconductor layer 112 to the first oxide layer 111, so that a concentration gradient in which the concentration of the element is continuously reduced in the thickness direction toward the insulating layer 107 may be obtained. Further, in the same manner, the element may be diffused from the first oxide semiconductor layer 112 to the second oxide semiconductor layer 113 or the second oxide layer 114, so that a concentration gradient in which the concentration of the element is continuously reduced in the thickness direction toward the gate insulating layer 104 may be obtained.

Such a structure enables an embedded n-type region in the stacked-layer structure including the first and second oxide semiconductor layers 112 and 113 where current mainly flows. The use of such a stacked-layer structure in the transistor makes it possible to effectively reduce the series resistance between the source and the drain of the transistor.

Providing the n-type second region 112b in the stacked-layer structure including the first oxide semiconductor layer 112 and the second oxide semiconductor layer 113 makes it possible to obtain a structure in which the first oxide layer 111 and the first region 112a in the first oxide semiconductor layer 112 are positioned between the second region 112b and the insulating layer 107. Therefore, a reduction in the mobility which is caused owing to mixing of the element contained in the insulating layer 107 (e.g., silicon) into the second region 112b that mainly serves as a current path can be inhibited. Similarly, with a structure in which the second oxide semiconductor layer 113 and second oxide layer 114 are positioned between the second region 112b and the gate insulating layer 104, a reduction in the mobility which is caused owing to mixing of the element contained in the gate insulating layer 104 (e.g., silicon) into the second region 112b can be inhibited.

[Band Structure of Oxide Stack]

The band structure of the oxide stack 110 is described.

FIGS. 2B and 2C each schematically illustrate part of the energy band structure in the thickness direction of the stacked-layer structure in FIG. 2A. FIG. 2B corresponds to a region which does not include the second region 112b in FIG. 2A, and FIG. 2C corresponds to a region which includes the second region 112b in FIG. 2A.

In FIG. 2B, EcI1 schematically represents the energy of the bottom of the conduction band in the insulating layer 107. Similarly, EcS1, EcS3, and EcI2 schematically represent the energies of the bottoms of the conduction band in the first oxide layer 111, the second oxide layer 114, and the gate insulating layer 104, respectively. In addition, EcS2 schematically represents the energy of the bottom of the conduction band in each of the first oxide semiconductor layer 112 and the second oxide semiconductor layer 113. Note that the thickness of each layer in FIG. 2A is not considered for convenience.

Note that although FIG. 2B shows the case where the first oxide layer 111 and the second oxide layer 114 are oxide layers having the same energy gap, the first oxide layer 111 and the second oxide layer 114 may be oxide layers which differ in energy gap and energy of the bottom of the conduction band. Similarly, although the case where the first oxide semiconductor layer 112 and the second oxide semiconductor layer 113 are oxide semiconductor layers having the same energy gap, the first oxide semiconductor layer 112 and the second oxide semiconductor layer 113 may differ in energy gap and energy of the bottom of the conduction band.

Here, an energy difference between the vacuum level and the bottom of the conduction band (the difference is also referred to as electron affinity) corresponds to a value obtained by subtracting an energy gap from an energy difference between the vacuum level and the top of the valence band (the difference is also referred to as an ionization potential). Note that the energy gap can be measured using a spectroscopic ellipsometer (e.g., UT-300 manufactured by HORIBA JOBIN YVON S.A.S.). Note that the energy difference between the vacuum level and the valence band top can be measured using an ultraviolet photoelectron spectroscopy (UPS) device (e.g., VersaProbe manufactured by ULVAC-PHI, Inc.).

As illustrated in FIG. 2B, the energy of the bottom of the conduction band continuously changes between the first oxide layer 111 and the first oxide semiconductor layer 112 and between the second oxide semiconductor layer 113 and the second oxide layer 114 without any barrier between them. This is because oxygen is easily diffused between the first oxide layer 111 and the first oxide semiconductor layer 112, and between the second oxide semiconductor layer 113 and the second oxide layer 114 since the layers have similar compositions, and thus a layer what is called a mixed layer is formed therebetween.

Accordingly to FIG. 2B, the first oxide semiconductor layer 112 and the second oxide semiconductor layer 113 in the oxide stack 110 form a well, and a channel is formed in the first oxide semiconductor layer 112 and the second oxide semiconductor layer 113 in the transistor including the oxide stack 110. Note that since the energy of the bottom of the conduction band in the oxide stack 110 continuously changes, the structure of the oxide stack 110 can also be referred to as a U-shaped well. Further, a channel formed to have such a structure can also be referred to as a buried channel.

In FIG. 2C, EcS2a schematically represents the energy of the bottom of the conduction band in each of the first region 112a in the first oxide semiconductor layer 112 and the second oxide semiconductor layer 113. Further, EcS2b schematically represents the energy of the bottom of the conduction band in the second region 112b in the first oxide semiconductor layer 112. EcS2b is lower than EcS2a.

As illustrated in FIG. 2C, the energy of the bottom of the conduction band continuously changes between the first region 112a and the second region 112b without any barrier between them. This is because the concentration of the element imparting conductivity to the oxide semiconductor in the second region 112b spreads in the thickness direction.

The element contained in the second region 112b might be diffused into the second oxide semiconductor layer 113 by heat treatment or the like after formation of the second oxide semiconductor layer 113. In such a case, the concentration of the element continuously changes from the second region 112b toward the second oxide semiconductor layer 113. As a result, as illustrated in FIG. 2C, the energy of the bottom of the conduction band continuously changes also between the second region 112b and the second oxide semiconductor layer 113 without any barrier therebetween.

Accordingly to FIG. 2C, in the oxide stack 110, the first region 112a and the second oxide semiconductor layer 113 each form a first well, and the second region 112b in the first oxide semiconductor layer 112 forms a second well. In other words, the well is further formed in the buried channel. Such a structure having two-stage wells can also be referred to as a double well structure. When the well is further provided in the first oxide semiconductor layer 112, larger current can flow therethrough.

Further, the well formed by the second region 112b is apart from the interface between first oxide layer 111 and the insulating layer 107 and the interface between the second oxide layer 114 and the gate insulating layer 104, and thus trap levels at the interfaces can be prevented from influencing the second region 112b serving as a main carrier path of the transistor.

The above is the description of the band structure of the oxide stack.

[Formation of Oxide Stack]

The first oxide layer 111 and the second oxide layer 114 are oxides that contain one or more kinds of metal elements contained in the first oxide semiconductor layer 112 or the second oxide semiconductor layer 113; therefore, the oxide stack 110 can also be referred to as an oxide stack including the layers having the same main components. The oxide stack, in which the layers contain the same main components and are stacked, is preferably formed to have not a simple stacked-layer structure of the layers but a continuous junction (here, in particular, a well structure having a U-shape in which the conduction band minimum energies changes continuously between the layers). This is because when an impurity which forms a defect level such as a trapping center or a recombination center is mixed at an interface between the layers, the continuity of the energy band is lost, and thus carriers are trapped or disappear by recombination at the interface.

In order to form a continuous junction, the layers are preferably stacked successively without exposure to the air with the use of a multi-chamber deposition apparatus (e.g., a sputtering apparatus) including a load lock chamber. Each chamber in the sputtering apparatus is preferably evacuated to high vacuum (about $5\times10^{-7}$ Pa to $1\times10^{-4}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

Not only high vacuum evaporation in a chamber but also high purity of a sputtering gas is necessary to obtain a high-purity intrinsic oxide semiconductor. When a highly purified gas having a dew point of $-40°$ C. or lower, preferably $-80°$ C. or lower, more preferably $-100°$ C. or lower is used as an oxygen gas or an argon gas used as a sputtering gas, moisture or the like can be prevented from entering an oxide semiconductor as much as possible.

The first oxide layer 111 provided below the first oxide semiconductor layer 112, and the second oxide layer 114 provided above the second oxide semiconductor layer 113 function as barrier layers and prevent the trap level formed at the interface between the insulating layer in contact with the oxide stack 110 (the insulating layer 107 and the gate insulating layer 104) and the oxide stack 110 from influencing the first oxide semiconductor layer 112 and the second oxide semiconductor layer 113 that serve as the main carrier path of the transistor.

For example, oxygen vacancy contained in the oxide semiconductor layer appears as localized states in deep energy area in the energy gap of the oxide semiconductor. A carrier is trapped in such localized states, so that reliability of the transistor is lowered. For this reason, oxygen vacancy contained in the oxide semiconductor layer need to be reduced. The oxide layers in which oxygen vacancy is less likely to be generated than in the first oxide semiconductor layer 112 and the second oxide semiconductor layer 113 are provided under and in contact with the first oxide semiconductor layer 112 and on and in contact with the second oxide semiconductor layer 113 in the oxide stack 110, whereby oxygen vacancy in the first oxide semiconductor layer 112 and the second oxide semiconductor layer 113 can be reduced. For example, in the first oxide semiconductor layer 112 and the second oxide semiconductor layer 113, the absorption coefficient due to the localized levels, which is obtained by measurement by a constant photocurrent method (CPM), can be lower than $1\times10^{-3}$/cm, preferably lower than $1\times10^{-4}$/cm.

In addition, when the first oxide semiconductor layer 112 is in contact with an insulating layer including a different constituent element (e.g., a base insulating layer including a silicon oxide film), an interface state is sometimes formed at the interface of the two layers and the interface state forms a channel. At this time, a second transistor having a different threshold voltage appears, so that an apparent threshold voltage of the transistor is varied. However, since the first oxide layer 111 contains one or more kinds of metal elements forming the first oxide semiconductor layer 112 in the oxide stack 110, an interface state is less likely to be formed at the interface between the first oxide layer 111 and the first oxide semiconductor layer 112. Thus, providing the first oxide layer 111 makes it possible to reduce variation in the electrical characteristics of the transistor, such as threshold voltage.

When a channel is formed at the interface between the gate insulating layer 104 and the second oxide semiconductor layer 113, interface scattering occurs at the interface and the field-effect mobility of the transistor is reduced. However, since the second oxide layer 114 contains one or more kinds of metal elements forming the second oxide semiconductor layer 113 in the oxide stack 110, scattering of carriers is less likely to occur at the interface between the second oxide semiconductor layer 113 and the second oxide layer 114, and thus the field-effect mobility of the transistor can be increased.

Further, the first oxide layer 111 and the second oxide layer 114 each also serve as a barrier layer which inhibits formation of an impurity level due to the entry of the constituent elements of the insulating layers (the insulating layer 107 and the gate insulating layer 104) which are in contact with the oxide stack 110 into the first oxide semiconductor layer 112 and the second oxide semiconductor layer 113.

For example, when a silicon-containing insulating layer is used for the insulating layer 107 or the gate insulating layer 104 which is in contact with the oxide stack 110, an impurity such as silicon in the insulating layer or carbon that might be mixed into the insulating layer can enter the first oxide layer 111 or the second oxide layer 114 at a depth of several nanometers from the interface. An impurity such as silicon, carbon, or the like entering the first oxide semiconductor layer 112 and the second oxide semiconductor layer 113 forms impurity levels. The impurity levels serve as a donor and generates an electron, so that the oxide semiconductor layer may become n-type.

However, when the thicknesses of the first oxide layer 111 and the second oxide layer 114 are larger than several nanometers, the impurity such as silicon or carbon which has entered the oxide semiconductor layer does not reach the first oxide semiconductor layer 112 and the second oxide semiconductor layer 113, so that the influence of impurity levels is suppressed.

Here, the concentration of silicon in each of the first region 112a in the first oxide semiconductor layer 112 and the second oxide semiconductor layer 113 is lower than or equal to $3\times10^{18}$ atoms/cm$^3$, preferably lower than or equal to $3\times10^{17}$ atoms/cm$^3$. Further, the concentration of carbon in each of the first region 112a in the first oxide semiconductor layer 112 and the second oxide semiconductor layer 113 is lower than or equal to $3\times10^{18}$ atoms/cm$^3$, preferably lower than or equal to $3\times10^{17}$ atoms/cm$^3$. In particular, the first oxide semiconductor layer 112 and the second oxide semiconductor layer 113 serving as a carrier path are preferably sandwiched or surrounded by the first oxide layer 111 and the second oxide layer 114 in order to prevent entry of much silicon or carbon, which is a Group 14 element, to the first region 112a in the first oxide semiconductor layer 112 and the second oxide semiconductor layer 113. That is, the concentrations of silicon and carbon contained in the first oxide semiconductor layer 112 and the second oxide semiconductor layer 113 are each preferably lower than those of the first oxide layer 111 and the second oxide layer 114.

Note that the impurity concentrations of the oxide semiconductor layers can be measured by secondary ion mass spectrometry.

Note that a trap level due to an impurity or defect can be formed in the vicinity of the interface between the first oxide layer 111 or the second oxide layer 114 and the insulating film such as the silicon oxide film. The presence of the first oxide layer 111 and the presence of the second oxide layer 114 enable the first oxide semiconductor layer 112 and the second oxide semiconductor layer 113 to be apart from the trap level. Note that in the case where the difference between the EcS1 and EcS2 or between EcS2 and EcS3 is small, electrons in the first oxide semiconductor layer 112 or the second oxide semiconductor layer 113 might reach the trap level by passing over the energy difference. When the electron is captured by the trap state, negative fixed electric charge is generated, so that the threshold voltage of the transistor is shifted to the positive direction.

Thus, the energy difference between EcS1 and EcS2 and the energy difference between EcS3 and EcS2 are each preferably greater than or equal to 0.1 eV, more preferably greater than or equal to 0.15 eV because the amount of change of the threshold voltage of the transistor is reduced and the transistor has stable electrical characteristics.

Each of the oxide layers included in the stacked-layer structure contains at least indium (In) and is deposited using a sputtering target with which a film can be formed by a sputtering method, preferably a DC sputtering method. When the sputtering target contains indium, the conductivity thereof is increased; therefore, film formation by a DC sputtering method is facilitated.

As a material forming the first oxide layer 111 and the second oxide layer 114, a material which is represented as an In-M-Zn oxide (M is a metal such as Al, Ti, Ga, Ge, Y, Zr, Sn, La, Ce, or Hf) is used. As M, Ga is preferably used. For example, a material which can be represented as $InGa_XZn_YO_Z$ ($3 \leq X \leq 6$, $1 \leq Y \leq 10$, $Z>0$) is preferably used. However, a material with a high proportion of Ga, specifically the material represented as $InGa_XZn_YO_Z$ with X exceeding 10, is not suitable because powder may be generated in the deposition and deposition by a sputtering method may become difficult.

Note that for each of the first oxide layer 111 and the second oxide layer 114, a material in which the proportion of indium in the atomic ratio is smaller than that in a material used for each of the first oxide semiconductor layer 112 and the second oxide semiconductor layer 113 is used. The indium and gallium contents in the oxide layers can be compared with each other by time-of-flight secondary ion mass spectrometry (also referred to as TOF-SIMS) or X-ray photoelectron spectrometry (also referred to as XPS).

Each of the oxide layers (the first oxide layer 111, the first oxide semiconductor layer 112, the second oxide semiconductor layer 113, and the second oxide layer 114) included in the multilayer structure may be in a non-single-crystal state, for example. The non-single-crystal state is, for example, structured by at least one of c-axis aligned crystal (CAAC), polycrystal, microcrystal, and an amorphous part. Among c-axis aligned crystal (CAAC), polycrystal, microcrystal, and an amorphous part, an amorphous part has the highest density of defect states, whereas CAAC has the lowest density of defect state. Note that the CAAC is described in detail later.

Each of the oxide layers included in the multilayer structure may include microcrystal, for example. A microcrystalline oxide film, for example, includes a microcrystal of greater than or equal to 1 nm and less than 10 nm.

Each of the oxide layers included in the multilayer structure may include an amorphous part, for example. An amorphous oxide film, for example, has disordered atomic arrangement and no crystalline component. Alternatively, an amorphous oxide film is, for example, absolutely amorphous and has no crystal part.

Note that the oxide layers included in the multilayer structure may each be a mixed film including any of a CAAC oxide, a microcrystalline oxide, and an amorphous oxide. The mixed film, for example, includes a region of an amorphous oxide, a region of a microcrystalline oxide, and a region of a CAAC oxide. Further, the mixed film may have a layered structure including a region of an amorphous oxide, a region of a microcrystalline oxide, and a region of a CAAC oxide, for example.

Each of the oxide layers included in the multilayer structure may be in a single-crystal state, for example.

It is preferable that each of the oxide layers included in the multilayer structure include a plurality of crystal parts, and in each of the crystal parts, a c-axis be aligned in a direction parallel to a normal vector of a surface where the oxide film is formed or a normal vector of a surface of the oxide film. Note that among crystal parts, the directions of the a-axis and the b-axis of one crystal part may be different from those of another crystal part. An example of such an oxide semiconductor film is a c-axis aligned crystalline oxide semiconductor (CAAC-OS) film.

When the first oxide layer 111 contains a constituent element (e.g., silicon) of the insulating layer 107 as an impurity, it might have an amorphous structure. Note that the first and second oxide semiconductor layers 112 and 113 in which a channel is formed preferably have a crystal part. In the case where the first oxide semiconductor layer 112 having a crystal part is stacked over the first oxide layer 111 having an amorphous structure, the oxide stack can be referred to as a hetero structure having different crystal structures.

In addition, the second oxide layer 114 may have an amorphous structure or include a crystal part. Formation of the second oxide layer 114 over the second oxide semiconductor layer 113 having a crystal part allows the second oxide layer 114 to have a crystal part. In this case, a boundary between the second oxide semiconductor layer 113 and the second oxide layer 114 cannot be clearly recognized by observation of the cross section with a transmission electron microscope (TEM) in some cases. Note that the first oxide layer 111 has lower crystallinity than the first oxide semiconductor layer 112 in many cases. Therefore, the boundary can be recognized by the degree of crystallinity.

[Crystallinity of Oxide]

It is preferable that at least one of the first oxide semiconductor layer 112 and the second oxide semiconductor layer 113 in the oxide stack 110 be a CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Figure 13A:
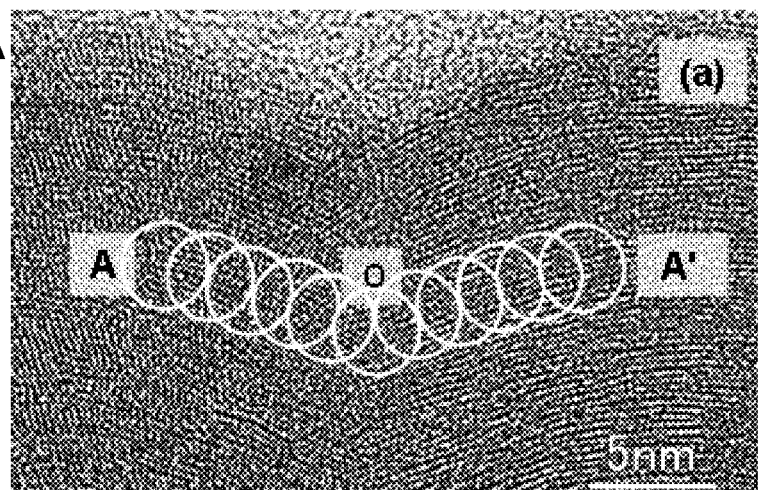
FIGS. 13A to 13C are cross-sectional TEM images and a local Fourier transform image of an oxide semiconductor.
Figure 13B:

FIG. 13A is a cross-sectional TEM image of a CAAC-OS film. FIG. 13B is a cross-sectional TEM image obtained by enlarging the image of FIG. 13A. In FIG. 13B, atomic arrangement is highlighted for easy understanding.

Figure 13C:
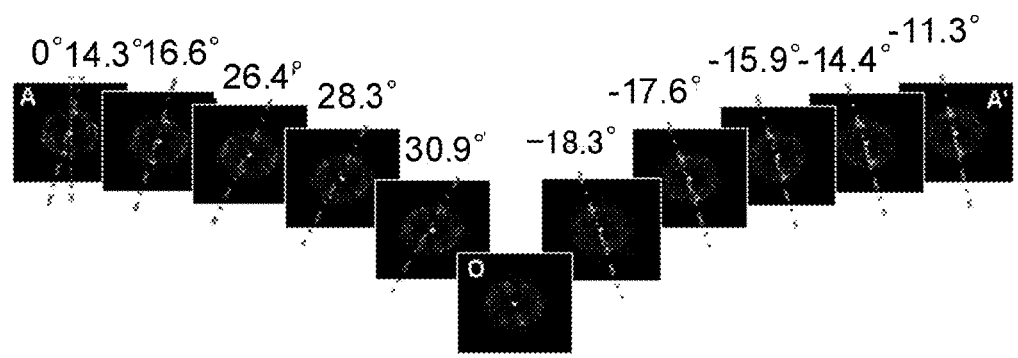

FIG. 13C is Fourier transform images of regions each surrounded by a circle (the diameter is about 4 nm) between A and O and between O and A' in FIG. 13A. C-axis alignment can be observed in each region in FIG. 13C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Note that in an electron diffraction pattern of the CAAC-OS film, spots (bright spots) indicating alignment are observed. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 19A).

From the results of the cross-sectional TEM images and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, in the CAAC-OS film to which an impurity is added, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appears at around 31° and a peak of $2\theta$ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In a TEM image of the polycrystalline oxide semiconductor film, for example, crystal grains can be found. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electric characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are observed in a nanobeam electron diffraction pattern of the nc-OS film obtained by using an electron beam having a probe diameter close to or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 19B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Accordingly, the nc-OS film has higher carrier density than the CAAC-OS film in some cases. An oxide semiconductor film with a high carrier density tends to have a high electron mobility. Therefore, a transistor using the nc-OS film has a high field-effect mobility in some cases. The nc-OS film has a higher density of defect states than the CAAC-OS film, and thus may have a lot of carrier traps. Consequently, a transistor using the nc-OS film has larger variation in electric characteristics and lower reliability than a transistor including the CAAC-OS film. Note that the nc-OS film can be obtained even when the amount of impurity contained therein is relatively large; thus, the nc-OS film is sometimes preferably used depending on the application. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystalline part. For example, the amorphous oxide semiconductor film does not have a specific state as in quartz.

In an image obtained with TEM, a crystal part cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has much higher carrier density than the nc-OS film in some cases. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electric characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electric characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has higher density than the CAAC-OS film. The CAAC-OS film has higher density than the microcrystalline oxide semiconductor film. The polycrystalline oxide semiconductor film has higher density than the microcrystalline oxide semiconductor film. The microcrystalline oxide semiconductor film has higher density than the amorphous oxide semiconductor film.

Note that an oxide semiconductor film may be a stacked-layer film including two or more kinds of an amorphous oxide semiconductor film, a microcrystalline oxide semiconductor film, and a CAAC-OS film, for example.

In the case where the oxide semiconductor film has a plurality of structures, the use of nanobeam electron diffraction may make it possible to analyze the structure.

Figure 19A:
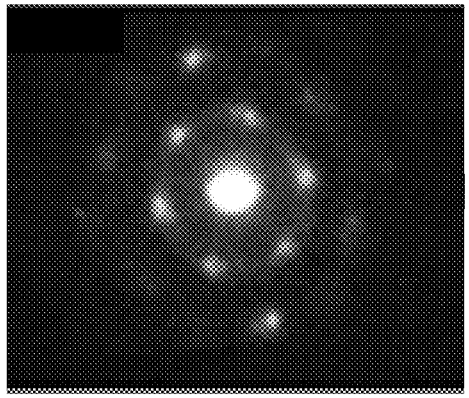
FIGS. 19A and 19B show nanobeam electron diffraction patterns of oxide semiconductor films and FIGS. 19C and 19D illustrate an example of a transmission electron diffraction measurement apparatus.
Figure 19B:
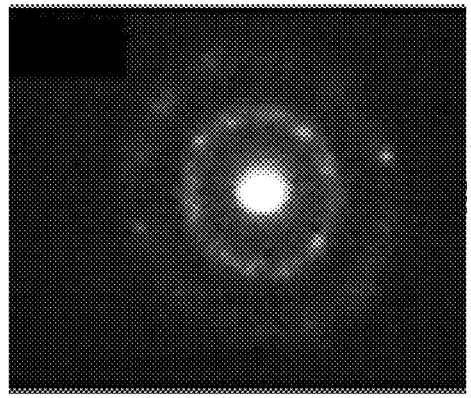
Figure 19C:
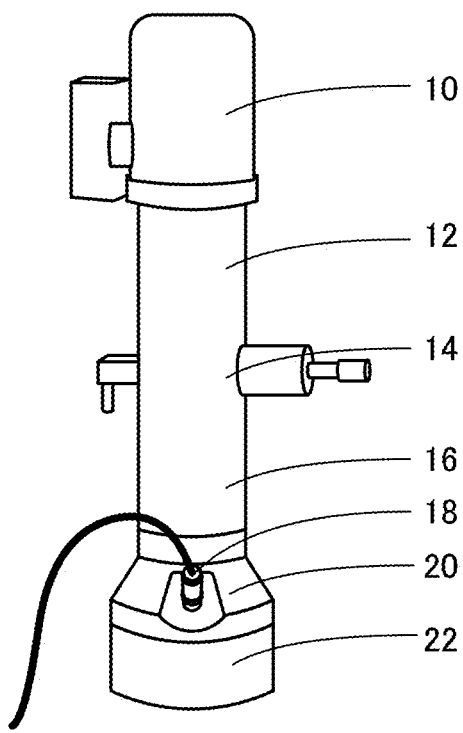

FIG. 19C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 19D:
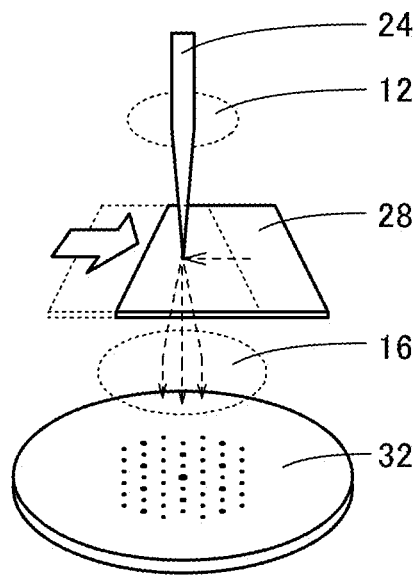

FIG. 19D illustrates an internal structure of the transmission electron diffraction measurement apparatus illustrated in FIG. 19C. In the transmission electron diffraction measurement apparatus, a substance 28 which is positioned in the sample chamber 14 is irradiated with electrons emitted from an electron gun installed in the electron gun chamber 10 through the optical system 12. The electrons which have passed through the substance 28 enter a fluorescent plate 32 which is installed in the observation chamber 20 through the optical system 16. A pattern which depends on the intensity of the incident electrons appears in the fluorescent plate 32, so that the transmitted electron diffraction pattern can be measured.

The camera 18 is installed so as to face the fluorescent plate 32 and can take a picture of a pattern appearing in the fluorescent plate 32. An angle which is formed by a line passing through the center of a lens of the camera 18 and the center of the fluorescent plate 32, and a line which passes through the center of the lens of the camera 18 and is perpendicular to a floor is, for example, greater than or equal to 15° and less than or equal to 80°, greater than or equal to 30° and less than or equal to 75°, or greater than or equal to 45° and less than or equal to 70°. As the angle is reduced, distortion of the transmission electron diffraction pattern taken by the camera 18 becomes larger. However, it is possible to correct the distortion of the obtained electron diffraction pattern if the angle is found in advance. Note that the film chamber 22 may be provided with the camera 18. For example, the camera 18 may be set in the film chamber 22 so as to be opposite to the incident direction of electrons 24 enter. In this case, a transmission electron diffraction pattern with few distortion can be taken from the rear surface of the fluorescent plate 32.

A holder for fixing the substance 28 that is a sample is provided in the sample chamber 14. Electrons which passes through the substance 28 penetrate the holder. Furthermore, the holder may have a function of transferring the substance 28 along the x-axis, the y-axis, the z-axis, or the like, for example. The holder may have a transfer function with accuracy such that a transfer distance of the substance 28 is within a range of, for example, longer than or equal to 1 nm and shorter than or equal to 10 nm, longer than or equal to 5 nm and shorter than or equal to 50 nm, longer than or equal to 10 nm and shorter than or equal to 100 nm, longer than or equal to 50 nm and shorter than or equal to 500 nm, or longer than or equal to 100 nm and shorter than or equal to 1 µm. These ranges may be optimized depending on the structure of the substance 28.

A method for measuring a transmission electron diffraction pattern of a substance is described using the above-described transmission electron diffraction measurement apparatus.

For example, changes in the structure of a substance can be observed by changing (scanning) the irradiation position of the electrons 24 that are a nanobeam in the substance, as illustrated in FIG. 19D. At this time, when the substance 28 is a CAAC-OS film, a diffraction pattern as shown in FIG. 19A is observed. When the substance 28 is an nc-OS film, a diffraction pattern shown in FIG. 19B is observed.

However, even when the substance 28 is a CAAC-OS film, a diffraction pattern that is partly similar to that of an nc-OS film is observed in some cases. Therefore, the quality of a CAAC-OS film may be represented by the proportion of a region where the diffraction pattern of a CAAC-OS film is observed in a certain area (the proportion is also referred to as the proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region where a pattern different from that of a CAAC-OS film is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was derived in such a manner that a diffraction pattern was obtained by performing scanning for 60 seconds at a rate of 5 nm/second, and the observed diffraction pattern was changed into a still image every 0.5 seconds. A nanobeam with a probe diameter of 1 nm was used as the electron beam. The above measurement was performed on six samples. The proportion of CAAC was calculated using the average value of the six samples.

Figure 20A:
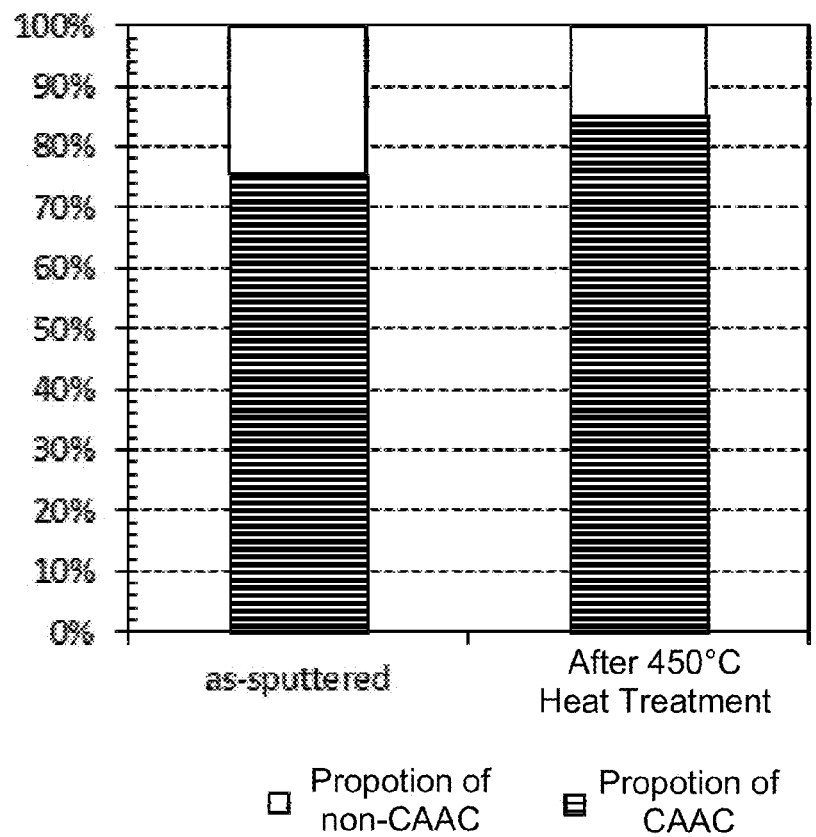
FIG. 20A shows an example of structural analysis by transmission electron diffraction measurement and FIGS. 20B and 20C show planar TEM images.

FIG. 20A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of the diffraction patterns different from that of a CAAC-OS film were similar to that of an nc-OS film. Further, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 20B:
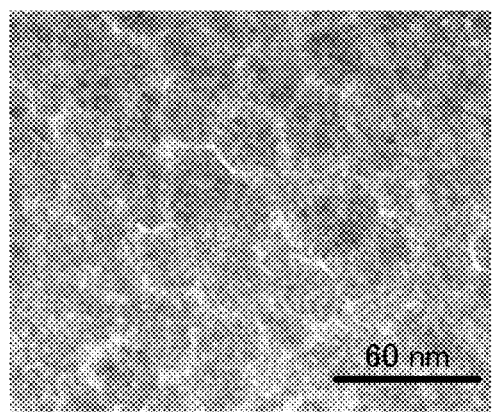
Figure 20C:
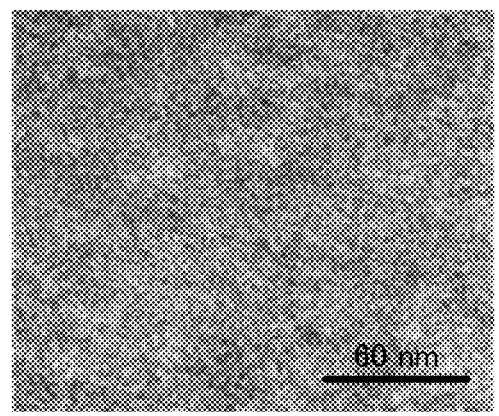

FIGS. 20B and 20C are planar TEM images of the CAAC-OS film obtained just after the deposition and the CAAC-OS film subjected to the heat treatment at 450° C., respectively. Comparison between FIGS. 20B and 20C shows that the CAAC-OS film subjected to the heat treatment at 450° C. has more uniform film quality. That is, the heat treatment at a high temperature improves the film quality of the CAAC-OS film.

Such a measurement method may make it possible to analyze the structure of an oxide semiconductor film having a plurality of structures.

Note that in the oxide stack 110, the first oxide layer 111 may have an amorphous structure and a CAAC-OS film may be deposited from a surface of the amorphous structure to be used as the first oxide semiconductor layer 112.

[Formation Method of the CAAC-OS Film]

For example, the CAAC-OS film is formed by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

The flat-plate-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm Note that in the flat-plate-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

By increasing the substrate temperature during the deposition, migration of sputtered particles is likely to occur after the sputtered particles reach a substrate surface. Specifically, the substrate temperature during the deposition is higher than or equal to 100° C. and lower than or equal to 740° C., preferably higher than or equal to 200° C. and lower than or equal to 500° C. By increasing the substrate temperature during the deposition, when the flat-plate-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap each other randomly, and a CAAC-OS film with a uniform thickness can be deposited.

By reducing the amount of impurities entering the CAAC-OS layer during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the CAAC-OS film for a short time. At the same time, the heat treatment in an inert atmosphere may generate oxygen vacancies in the CAAC-OS film. In such a case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS film for a shorter time.

In the heat treatment, a heating mechanism utilizing a resistance heater, a lamp, or the like or a heating mechanism utilizing heat conduction or heat radiation from a medium such as a heated gas, such as rapid thermal annealing (RTA) such as gas rapid thermal annealing (GRTA) or lamp rapid thermal annealing (LRTA) can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas. With the RTA apparatus, the process time can be shortened and thus the RTA apparatus is preferred for mass production. Alternatively, an in-line heating apparatus may be used in the heat treatment.

As an example of the sputtering target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 1:1:2, 3:1:4, 1:3:1, 1:3:2, 1:3:4, 1:6:2, 1:6:4, 1:6:5, 1:6:8, or 3:1:2. The kinds of powder and the molar ratio for mixing powder may be determined as appropriate depending on a desired sputtering target.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

As described above, a CAAC-OS film with a total thickness of greater than or equal to 10 nm can be formed. The CAAC-OS film can be favorably used as the oxide semiconductor layer in the oxide stack.

The oxide semiconductor film obtained by such a formation method has high crystallinity even when being provided over, for example, an amorphous surface, an amorphous insulating surface, or an amorphous oxide surface.

Next, a method for forming an oxide film in the case where a formation surface has a low temperature (e.g., a temperature lower than 130° C., lower than 100° C., or lower than 70° C., or about a room temperature (20° C. to 25° C.)) because, for example, the substrate is not heated is described.

In the case where the formation surface has a low temperature, sputtered particles fall irregularly to the deposition surface. For example, migration does not occur; therefore, the sputtered particles are randomly deposited on the deposition surface including a region where other sputtered particles have been deposited. That is, an oxide film obtained by the deposition might have a non-uniform thickness and a disordered crystal alignment. The oxide film obtained in the above manner maintains the crystallinity of the sputtered particles to a certain degree and thus has a crystal part (nanocrystal).

For example, in the case where the pressure at the deposition is high, the frequency with which the flying sputtered particle collides with another particle (e.g., an atom, a molecule, an ion, or a radical) of argon or the like is increased. When the flying sputtered particle collides with another particle (resputtered), the crystal structure of the sputtered particle might be broken. For example, when the sputtered particle collides with another particle, the plate-like shape of the sputtered particle cannot be kept, and the sputtered particle might be broken into parts (e.g., atomized). At this time, when atoms obtained from the sputtered particle are deposited on the formation surface, an amorphous oxide semiconductor film might be formed.

In the case where not a sputtering method using a target including polycrystalline oxide but a deposition method using liquid or a method for depositing a film by vaporizing a solid such as a target is used, the atoms separately fly to be deposited over the formation surface; therefore, an amorphous oxide film might be formed. Further, for example, by a laser ablation method, atoms, molecules, ions, radials, clusters, or the like released from the target flies to be deposited over the formation surface; therefore, an amorphous oxide film might be formed.

The above is the description of the oxide stack.

Modification Example

A modification example whose structure is partly different from that of the transistor in FIGS. 1A to 1D2 is described below.

Figure 3C:
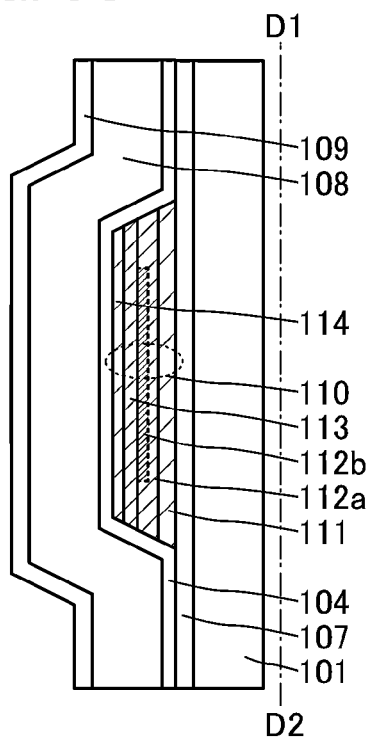
Figure 3B:
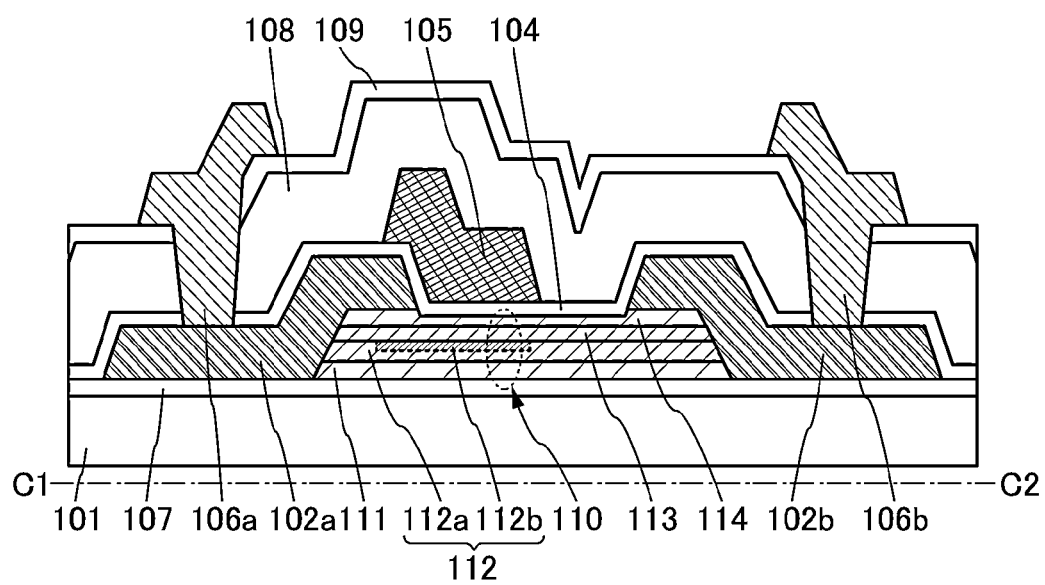

FIGS. 3A to 3C illustrate a transistor 150 that is an example described in this modification example. FIG. 3A is a schematic top view of the transistor 150. FIGS. 3B and 3C are schematic cross-sectional views taken along lines C1-C2 and D1-D2 in FIG. 3A, respectively. Note that FIG. 3A illustrates only main components for simplicity.

The transistor 150 has the same structure as Structural example 1 except the shape of the gate electrode 105.

The gate electrode 105 of the transistor 150 overlaps the first electrode 102a and does not overlap the second electrode 102b.

The second electrode 102b that can function as a drain electrode and the gate electrode 105 do not overlap each other to be separated from each other, whereby withstand voltage between the gate and the drain can be improved. Therefore, even when the transistor 150 is driven at an extremely high voltage, high reliability can be ensured.

As illustrated in FIGS. 3A and 3B, it is preferable that an end portion of the second region 112b on the second electrode 102b side in the first oxide semiconductor layer 112 be located on the inside of the gate electrode 105. In other words, the gate electrode 105 preferably extends to be closer to the second electrode 102b than the second region 112b is. Note that an end portion of the gate electrode 105 on the second electrode 102b side may be aligned with the end portion of the second region 112b on the second electrode 102b side.

The n-type second region 112b is provided on the inside of the gate electrode 105, whereby the transistor characteristics can be prevented from becoming normally on. When the length of a portion where the gate electrode 105 and a region between the source and the drain overlap each other is referred to as a gate length, the length in the direction of the source and the drain of a region which is between the source and the drain and where the gate electrode 105 and the second region 112b overlap each other is, for example, less than or equal to the gate length, preferably less than or equal to 0.8 times, further preferably less than or equal to 0.5 times the gate length.

The structure of the modification example can improve the withstand voltage between the gate and the drain, whereby a highly reliable transistor in which higher current can flow can be obtained. Further, a normally-off transistor can be obtained.

The above is the description of this modification example.

Manufacturing Method Example 1

An example of a method for manufacturing the semiconductor device of one embodiment of the present invention is described below with reference to drawings.

[Example of Method for Manufacturing Transistor]

Here, an example of a method for manufacturing the transistor 150 described in the above modification example is described. FIGS. 4A to 4D and FIGS. 5A to 5C are schematic cross-sectional views of the manufacturing process.

[Formation of Insulating Layer 107]

First, the insulating layer 107 is formed over the substrate 101.

As the substrate 101, a substrate which is resistant to heat in the manufacturing process is used. For example, a glass substrate, a metal substrate, an alloy substrate, a single crystal semiconductor substrate of silicon, silicon carbide, or the like can be used. Alternatively, a substrate in which a device such as another transistor is formed on the substrate 101 may be used. In this case, the device may be formed so as to be electrically connected to at least one of the first electrode 102*a*, the second electrode 102*b*, and the gate electrode 105 of the transistor 150.

In the case where heat generated at the time when large current flows in the transistor causes a problem, a material having high thermal conductivity is preferably used for the substrate 101. For example, a metal substrate, an alloy substrate, a semiconductor substrate, or the like can be used.

The insulating layer 107 can be formed by a plasma chemical vapor deposition (CVD) method, a sputtering method, or the like using an insulating film containing oxygen, such as an insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide. Alternatively, as the insulating layer 107, an oxide film formed by thermally oxidizing the surface of the substrate 101 may be used.

The insulating layer 107 has a function of supplying oxygen to the oxide stack 110 as well as a function of preventing diffusion of an impurity from the substrate 101; thus, an insulating layer containing oxygen is used as the insulating layer 107. Note that in the case where the substrate 101 is a substrate where another device is formed as described above, the insulating layer 107 also has a function as an interlayer insulating layer. In that case, the insulating layer 107 is preferably subjected to planarization treatment such as chemical mechanical polishing (CMP) treatment so as to have a flat surface.

In the transistor 150 in this embodiment, the insulating layer 107 containing oxygen is provided below the stacked-layer structure (the oxide stack 110) including the oxide semiconductor layers. With such a structure, oxygen in the insulating layer 107 can be supplied to the channel formation region. The insulating layer 107 preferably has a region containing oxygen in excess of the stoichiometric composition. When the insulating layer 107 contains excess oxygen, supply of oxygen to the channel formation region can be promoted.

Note that in this specification and the like, excess oxygen means oxygen which can be transferred in an oxide semiconductor layer, an oxide layer, silicon oxide, or silicon oxynitride, oxygen which exists in excess of the intrinsic stoichiometric composition, or oxygen having a function of filling Vo (oxygen vacancies) generated due to lack of oxygen.

It is preferable that the insulating layer 107 be formed with a material containing oxygen, which can supply oxygen to at least the oxide stack 110 to be formed later. Further, the insulating layer 107 is preferably a film containing excess oxygen.

In order to make the insulating layer 107 contain excess oxygen, the insulating layer 107 may be formed in an oxygen atmosphere, for example. Alternatively, the insulating layer 107 may excessively contain oxygen in such a manner that oxygen is introduced into the insulating layer 107 which has been formed. Both the methods may be combined.

For example, oxygen (at least including any of oxygen radicals, oxygen atoms, and oxygen ions) is introduced into the insulating layer 107 which has been deposited, whereby a region excessively containing oxygen is formed. As a method for introducing oxygen, an ion implantation method, an ion doping method, a plasma immersion ion implantation method, plasma treatment, or the like may be employed. A gas containing oxygen can be used for the oxygen introducing treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment.

[Formation of First Oxide Layer 111 and First Oxide Semiconductor Layer 112]

Figure 4A:
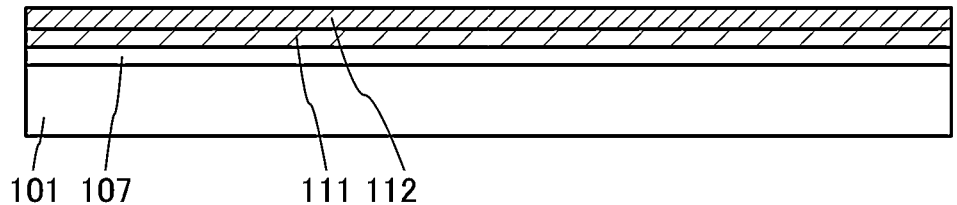
FIGS. 4A to 4D illustrate an example of a method for manufacturing the semiconductor device of the embodiment.

Next, the first oxide layer 111 and the first oxide semiconductor layer 112 are sequentially stacked over the insulating layer 107 (see FIG. 4A). The first oxide layer 111 and the first oxide semiconductor layer 112 are deposited by a sputtering method, a chemical vapor deposition (CVD) method, a molecular beam epitaxy (MBE) method, an atomic layer deposition (ALD) method, a pulsed laser deposition (PLD) method, or the like.

Any of the materials described in Structural example 1 can be used for the first oxide layer 111 and the first oxide semiconductor layer 112, and the second oxide semiconductor layer 113 and the second oxide layer 114 which are formed later.

For example, the first oxide layer 111 is preferably formed using an In—Ga—Zn oxide having an atomic ratio of In:Ga:Zn=1:1:1, an In—Ga—Zn oxide having an atomic ratio of In:Ga:Zn=1:3:2, an In—Ga—Zn oxide having an atomic ratio of In:Ga:Zn=1:6:4, an In—Ga—Zn oxide having an atomic ratio of In:Ga:Zn=1:9:6, or an oxide having a composition which is in the neighborhood of any of the above atomic ratios.

Further, for example, the first oxide semiconductor layer 112 and the second oxide semiconductor layer 113 are preferably formed using an In—Ga—Zn oxide having an atomic ratio of In:Ga:Zn=1:1:1, an In—Ga—Zn oxide having an atomic ratio of In:Ga:Zn=3:1:2, or an oxide having a composition which is in the neighborhood of any of the above atomic ratios.

For example, the second oxide layer 114 is preferably formed using an In—Ga—Zn oxide having an atomic ratio of In:Ga:Zn=1:1:1, an In—Ga—Zn oxide having an atomic ratio of In:Ga:Zn=1:3:2, an In—Ga—Zn oxide having an atomic ratio of In:Ga:Zn=1:6:4, an In—Ga—Zn oxide having an atomic ratio of In:Ga:Zn=1:9:6, or an oxide having a composition which is in the neighborhood of any of the above atomic ratios.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example.

Note that the composition of each of the layers is not limited to the above atomic ratios. Note that the first oxide semiconductor layer 112 preferably has a higher content of indium than the first oxide layer 111, and the second oxide semiconductor layer 113 preferably has a higher content of indium than the second oxide layer 114. In an oxide semiconductor, the s orbital of heavy metal mainly contributes to carrier transfer, and when the content of indium in the oxide semiconductor is increased, overlap of the s orbitals is likely to be increased. Therefore, an oxide having a composition in which the proportion of indium is higher than that of gallium has higher mobility than an oxide having a composition in which the proportion of indium is equal to or lower than that of gallium. Further, gallium needs large formation energy of an oxygen vacancy and thus is not likely to generate an oxygen vacancy as compared to indium. Therefore, an oxide having a high gallium content has stable characteristics.

Thus, with the use of an oxide having a high content of indium for the first oxide semiconductor layer 112 and the second oxide semiconductor layer 113, a transistor having high field-effect mobility can be obtained. Further, when an oxide having a high content of gallium is used for on a side of an interface with the insulating layer, the transistor can have higher reliability.

An oxide semiconductor that can be used for the first oxide layer 111, the first oxide semiconductor layer 112, the second oxide semiconductor layer 113, and the second oxide layer 114 preferably contains at least indium (In) or zinc (Zn). Alternatively, both In and Zn are preferably contained. Specifically, it is preferable that the first oxide semiconductor layer 112 and the second oxide semiconductor layer 113 contain indium because the carrier mobility of the transistor can be increased, and the first oxide semiconductor layer 112 and the second oxide semiconductor layer 113 contain zinc because a CAAC-OS film is formed easily. In order to reduce variation in electrical characteristics of the transistors including the oxide semiconductor layer, the oxide semiconductor layer preferably contains a stabilizer in addition to indium and zinc.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

For example, any of the following oxides, or specifically oxide semiconductors, can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that as described in Structural example 1 in detail, the materials are selected so that the first oxide layer 111 has higher electron affinity than the first oxide semiconductor layer 112 and the second oxide layer 114 has higher electron affinity than the second oxide semiconductor layer 113.

Note that the layers included in the oxide stack 110 are preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Note that oxygen may be introduced into the first oxide layer 111 at timing which is after formation of the first oxide layer 111 and before formation of the first oxide semiconductor layer 112. By the oxygen introduction treatment, the first oxide layer 111 contains excess oxygen, so that the excess oxygen can be supplied to the first oxide semiconductor layer 112 by heat treatment in a later film formation step. Further, by heat treatment after the step for depositing the second oxide semiconductor layer 113, the excess oxygen can be supplied to the second oxide semiconductor layer 113. As a result, oxygen vacancy in the first oxide semiconductor layer 112 and the second oxide semiconductor layer 113 can be effectively reduced.

The preferable and typical amount of oxygen which is added to the first oxide layer 111 is, in the case of using an ion implantation method, a dosage higher than or equal to $5 \times 10^{14}$ atoms/cm$^2$ and lower than or equal to $1 \times 10^{17}$ atoms/cm$^2$. It is preferable that the amount of oxygen which is added be large enough to enable a reduction in oxygen vacancy in the oxide semiconductor film which is to be formed later, and the amount is typically $5 \times 10^{14}$ atoms/cm$^2$ or more, preferably $1 \times 10^{15}$ atoms/cm$^2$ or more. At the same time, the higher the amount of added oxygen, the longer the treatment time and the lower the productivity; thus, the amount is preferably $1 \times 10^{17}$ atoms/cm$^2$ or less, further preferably $5 \times 10^{16}$ atoms/cm$^2$ or less, still further preferably $2 \times 10^{16}$ atoms/cm$^2$ or less.

Note that the first oxide layer 111 becomes amorphous by the oxygen introduction treatment in some cases. In the oxide stack 110, at least the first oxide semiconductor layer 112 and the second oxide semiconductor layer 113 are preferably CAAC-OS films. Accordingly, the oxygen introduction treatment is preferably performed at timing which is after formation of the first oxide layer 111 and before formation of the first oxide semiconductor layer 112.

[Formation of Second Region 112b]

Next, a resist mask 121 is formed over the first oxide semiconductor layer 112. The resist mask 121 is formed to cover the first oxide semiconductor layer 112 except a region to be the second region 112b.

Figure 4B:
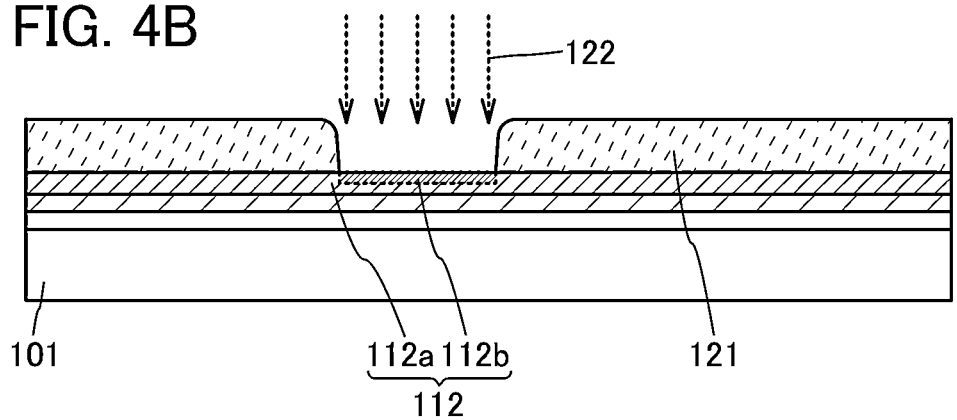

Then, an element 122 is introduced into the region of the first oxide semiconductor layer 112 which is not covered with the resist mask 121 (see FIG. 4B).

As the element 122, in addition to phosphorus (P), elements belonging to Group 15 (e.g., arsenic (As) and antimony (Sb)), boron (B), aluminum (Al), nitrogen (N), argon (Ar), helium (He), neon (Ne), indium (In), fluorine (F), chlorine (Cl), hydrogen (H), titanium (Ti), or zinc (Zn) may be used.

The element 122 which is introduced preferably contains at least one of a radical, an atom, a molecule, and an ion.

Examples of a method for introducing the element to the first oxide semiconductor layer 112 include an ion implantation method, an ion doping method, and a plasma immersion ion implantation method. Alternatively, heat treatment or plasma treatment in an atmosphere containing the element 122 may be used.

The conditions in the introduction of the element 122 are preferably set so that the element 122 does not reach the interface between the first oxide semiconductor layer 112 and the first oxide layer 111. The element 122 is preferably introduced so that a region having the highest concentration of the element 122 in the thickness direction is located in the first oxide semiconductor layer 112 in the vicinity of the surface of the first oxide semiconductor layer 112 (for example, the region having the highest concentration is formed in a range from the surface to a thickness of 20 nm, preferably 10 nm, further preferably 5 nm). Alternatively, the element 122 is preferably introduced so that the region having the highest concentration of the element 122 is located in the first oxide semiconductor layer 112 and the distance between the region and the surface of the first oxide semiconductor layer 112 is preferably less than or equal to ¾, further preferably less than or equal to ½, still further preferably less than or equal to ¼ of the thickness of the first oxide semiconductor layer 112.

By the introduction of the element 122 in such a method, the second region 112b that is an n-type region and the first region 112a that has a lower concentration of the element 122 than the second region 112b can be formed in the first oxide semiconductor layer 112. The first region 112a is preferably i-type or substantially i-type.

After the introduction of the element 122, the resist mask 121 is removed.

[Formation of Second Oxide Semiconductor Layer 113 and Second Oxide Layer 114]

Figure 4C:
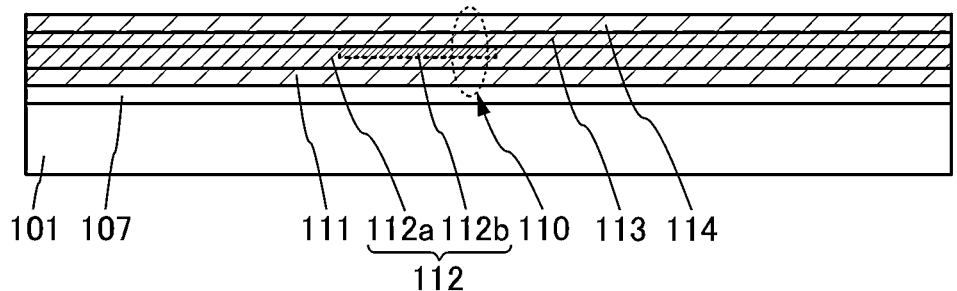

Next, the second oxide semiconductor layer 113 and the second oxide layer 114 are sequentially stacked over the first oxide semiconductor layer 112 (see FIG. 4C). At this stage, the oxide stack 110 is formed.

The second oxide semiconductor layer 113 and the second oxide layer 114 can be formed using the materials and methods described above.

After the second oxide semiconductor layer 113 and the second oxide layer 114 are formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidization gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, an impurity such as hydrogen or water can be removed from the insulating layer 107 and the oxide stack 110. Further, by the heat treatment, oxygen can be supplied from the insulating layer 107 to the oxide stack 110.

The heat treatment may be performed at any timing as long as it is performed after the first oxide semiconductor layer 112 is formed and may be performed repeatedly. For example, the heat treatment may be performed just after the formation of the first oxide semiconductor layer 112, just after the formation of the second oxide layer 114, or in a later step.

Here, after formation of the oxide stack 110, treatment for improving the crystallinity of the oxide stack 110 may be performed. The improvement in at least the crystallinity of the first oxide semiconductor layer 112 and the crystallinity of the second oxide semiconductor layer 113 improves the electrical characteristics of the transistor.

As the treatment for improving the crystallinity of the oxide stack 110, heat treatment using irradiation with an energy beam is preferably performed. A typical example of the energy beam is a laser beam. The laser beam used for irradiation of the oxide stack 110 is preferably a pulsed laser beam. This is because the substrate over which the oxide stack 110 is formed is not thermally damaged and the irradiation region of the laser beam can be heated to a temperature at which the region is instantly crystallized.

The laser beam that heats the oxide stack 110 preferably has a short wavelength with an energy higher than the band gap of the oxide semiconductor contained in the oxide stack 110 so that the laser beam is absorbed by the oxide stack 110. An example of a light source of a laser beam having such a wavelength is an excimer laser. As the excimer laser, XeCl (308 nm), KrF (248 nm), ArF (193 nm), or the like can be used. The third harmonic of a YAG laser or the like may be used.

Figure 4D:
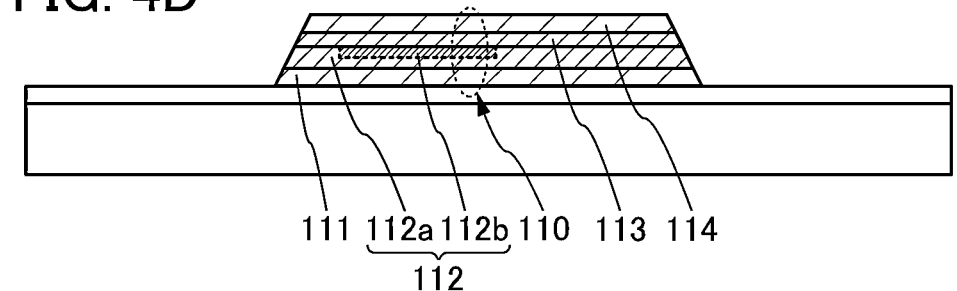

Next, an unnecessary portion of the oxide stack 110 is etched by a photolithography method or the like, so that the oxide stack 110 is processed into an island shape (see FIG. 4D).

At this time, the etching is preferably performed so that the side surface of the second region 112b in the first oxide semiconductor layer 112 is not exposed.

Through the above process, the island-shaped oxide stack 110 can be formed.

[Formation of First Electrode 102a and Second Electrode 102b]

Figure 5A:
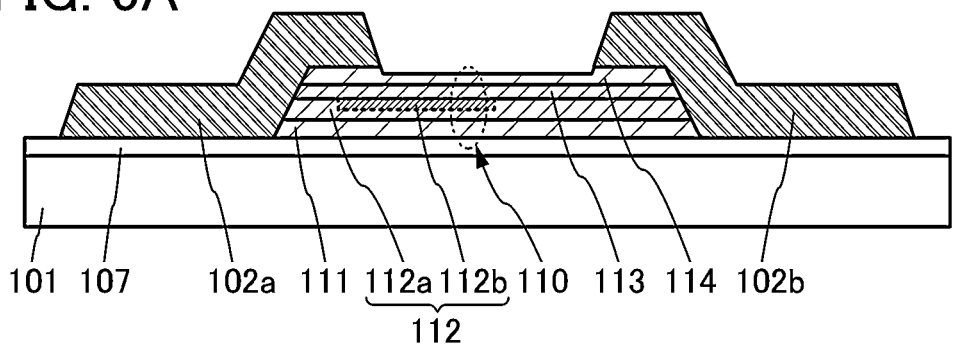
FIGS. 5A to 5C illustrate the example of the method for manufacturing the semiconductor device of the embodiment.

Next, a conductive film is formed over the oxide stack 110 and an unnecessary portion is etched to form the first electrode 102a and the second electrode 102b (see FIG. 5A).

As the material of the conductive film, a metal such as Al, Cr, Cu, Ta, Ti, Mo, or W, or an alloy containing any of these metals can be used. The conductive film can be formed by a sputtering method, or the like.

At the time of etching the conductive film, an upper portion of the oxide stack 110 might be etched, so that part of the first oxide layer 111 might be thinned or disappear. Therefore, the thickness of the first oxide layer 111 at the time of the formation is preferably set in consideration of influence by the etching.

When dry etching is used for the etching of the conductive film, an etching residue might remain on the surface of the oxide stack 110 or on the surface of the insulating layer 107. In such a case, cleaning treatment is preferably performed to remove the etching residue. A short circuit of the first electrode 102a and the second electrode 102b can be suppressed by the cleaning treatment. The cleaning treatment can be performed using an alkaline solution such as a tetramethylammonium hydroxide (TMAH) solution, an acidic solution such as diluted hydrofluoric acid, an oxalic acid solution, or a phosphorus acid solution.

Then, heat treatment similar to the above-mentioned heat treatment may be performed.

[Formation of Gate Insulating Layer 104]

Then, the gate insulating layer 104 is formed over the oxide stack 110, the first electrode 102a, and the second electrode 102b.

As the material of the gate insulating layer 104, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like can be used. Note that the gate insulating layer 104 may be a stacked layer of any of the above materials. The gate insulating layer 104 can be formed by a sputtering method, a CVD method, an MBE method, an ALD method, a PLD method, or the like.

In a manner similar to the insulating layer 107, the gate insulating layer 104 may play not only a role of inhibiting diffusion of an impurity to the oxide stack 110 but also a role of supplying oxygen to the oxide stack 110, and is preferably formed using an insulating layer containing oxygen.

After the formation of the gate insulating layer 104, heat treatment may be performed. The heat treatment can be performed under the same conditions as those described above. By the heat treatment, oxygen is effectively supplied from the layer containing oxygen and surrounding the oxide stack 110 to the oxide stack 110, so that oxygen vacancy in each of the first oxide semiconductor layer 112 and the second oxide semiconductor layer 113 can be reduced.

[Formation of Gate Electrode 105]

Figure 5B:
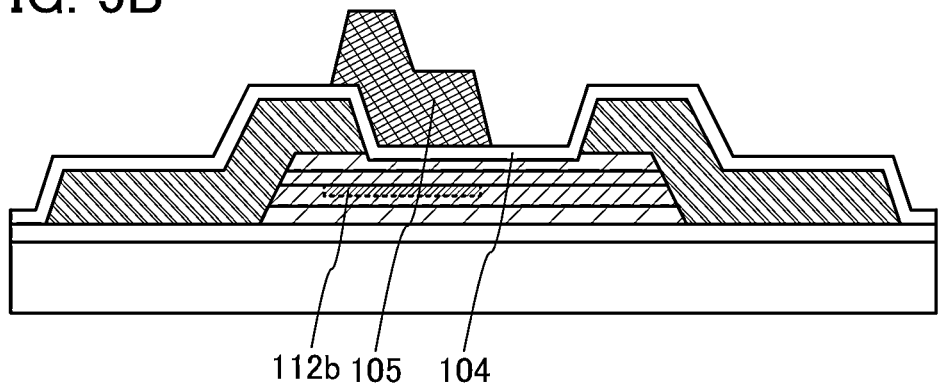

Next, a conductive film is formed over the gate insulating layer 104 and an unnecessary portion is etched to form the gate electrode 105 (see FIG. 5B).

As the material of the conductive film, a metal such as Al, Ti, Cr, Co, Ni, Cu, Y, Zr, Mo, Ru, Ag, Ta, or W, or an alloy material containing any of these metals. The conductive film can be formed by a sputtering method, or the like.

Here, an example in which the gate electrode 105 overlaps the first electrode 102a and does not overlap the second electrode 102b is described as illustrated in FIG. 5B. At this time, the gate electrode 105 preferably extends to be closer to the second electrode 102b than the second region 112b is.

Note that to manufacture the transistor 100 illustrated as an example in FIGS. 1A to 1D2, the gate electrode 105 may be processed so as to overlap both the first electrode 102a and the second electrode 102b, and the manufacturing method example 1 can be referred to for the other steps.

After the formation of the gate electrode 105, heat treatment may be performed. The heat treatment can be performed under the same conditions as those described above. By the heat treatment, oxygen is effectively supplied from the layer containing oxygen and surrounding the oxide stack 110 to the oxide stack 110, so that oxygen vacancy in each of the first oxide semiconductor layer 112 and the second oxide semiconductor layer 113 can be reduced.

[Formation of Insulating Layer 108 and Insulating Layer 109]

Next, the insulating layer 108 and the insulating layer 109 are sequentially stacked over the gate insulating layer 104 and the gate electrode 105.

As the material of the insulating layer 108 and the insulating layer 109, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like can be used. Note that the insulating layer 108 and the insulating layer 109 may be a stacked layer of any of the above materials. The insulating layer 108 and the insulating layer 109 can be formed by a sputtering method, a CVD method, an MBE method, an ALD method, a PLD method, or the like.

Here, as the insulating layer 108, a layer with a low oxygen-transmitting property (or with an oxygen barrier property) is preferably used. Examples of the material of the layer with a low oxygen-transmitting property include aluminum oxide and nitrides such as silicon nitride and silicon nitride oxide. When the insulating layer 108 with a low oxygen-transmitting property is provided to cover the gate insulating layer 104, oxygen which is released from the insulating layer 107 or from both the insulating layer 107 and the gate insulating layer 104 by heat treatment performed later can be prevented from diffusing to the outside through the insulating layer 108, whereby the oxygen can be effectively supplied to the oxide stack 110.

Alternatively, a layer containing oxygen that may serve as a supply source of oxygen to the oxide stack 110 (i.e., containing excessive oxygen) may be used as the insulating layer 108, and a layer with a low oxygen-transmitting property may be used as the insulating layer 109. At this time, oxygen released from the insulating layer 108 by the heat treatment can be prevented from diffusing to the outside through the insulating layer 109, so that the oxygen can be more effectively supplied to the oxide stack 110.

After the formation of the insulating layer 108 or after the formation of the insulating layer 108 and the insulating layer 109, heat treatment may be performed. The heat treatment can be performed under the same conditions as those described above. By the heat treatment, oxygen is effectively supplied from the layer containing oxygen and surrounding the oxide stack 110 to the oxide stack 110, so that oxygen vacancy in each of the first oxide semiconductor layer 112 and the second oxide semiconductor layer 113 can be reduced.

Then, the insulating layer 109 and the insulating layer 108 are selectively etched to form an opening portion reaching the first electrode 102a and an opening portion reaching the second electrode 102b.

Figure 5C:
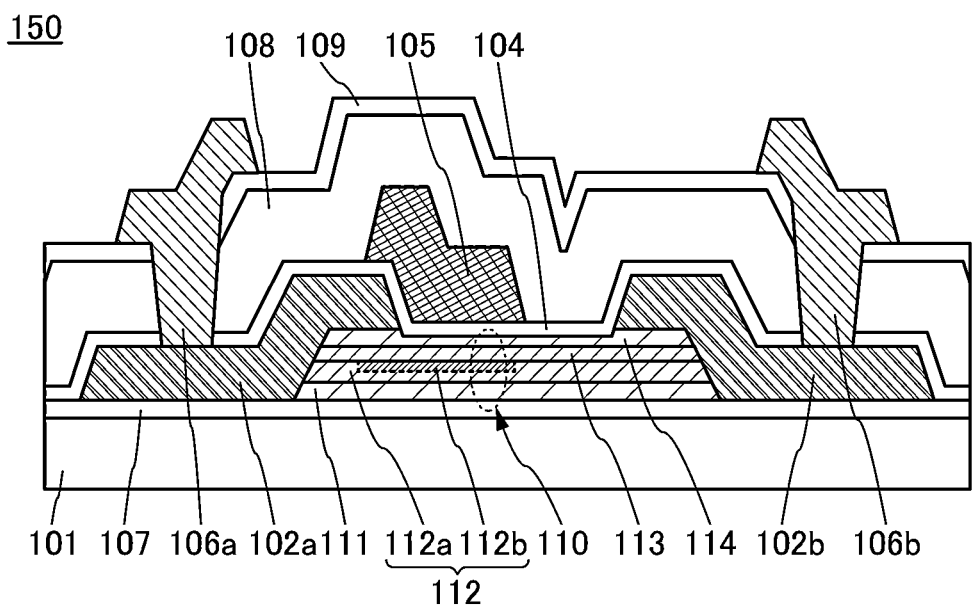

After that, a conductive film is formed over the insulating layer 109 and an unnecessary portion is removed by etching, whereby the electrode 106a electrically connected to the first electrode 102a and the electrode 106b electrically connected to the second electrode 102b are formed (see FIG. 5C).

As the material of the conductive film, any of the materials used for the first electrode 102a, the second electrode 102b, and the gate electrode 105 can be used.

After the formation of the electrode 106a and the electrode 106b, heat treatment may be performed. The heat treatment can be performed under the same conditions as those described above. By the heat treatment, oxygen is effectively supplied from the layer containing oxygen and surrounding the oxide stack 110 to the oxide stack 110, so that oxygen vacancy in each of the first oxide semiconductor layer 112 and the second oxide semiconductor layer 113 can be reduced.

Through the above process, the transistor 150 can be manufactured.

The above is the description of this manufacturing method example.

Modification Example 1

An example of a method for manufacturing a transistor which is partly different from the example of method for manufacturing a transistor is described below. Note that different points from those described above are described below, and the common portions may be omitted.

First, in a manner similar to the above manufacturing method, the insulating layer 107, the first oxide layer 111, and the first oxide semiconductor layer 112 are formed over the substrate 101. Subsequently, the resist mask 121 is formed over the first oxide semiconductor layer 112. Then, the element 122 is introduced to part of the first oxide semiconductor layer 112 through an opening portion of the resist mask 121, so that the second region 112b containing the element 122 and the first region 112a having a low concentration of the element 122 are formed in the first oxide semiconductor layer 112 (see FIG. 6A).

After the introduction of the element 122, the resist mask 121 is removed.

Next, unnecessary portions of the first oxide layer 111 and the first oxide semiconductor layer 112 are etched by a photolithography method or the like, whereby the first oxide layer 111 and the first oxide semiconductor layer 112 are processed into an island shape (see FIG. 6B).

Then, the second oxide semiconductor layer 113 and the second oxide layer 114 are formed to cover the first oxide semiconductor layer 112. After that, unnecessary portions of the second oxide semiconductor layer 113 and the second oxide layer 114 are etched by a photolithography method or the like, so that the second oxide semiconductor layer 113 and the second oxide layer 114 are processed into an island shape (see FIG. 6C).

At this time, as illustrated in FIG. 6C, the processing is preferably performed so that the stack including the second oxide semiconductor layer 113 and the second oxide layer 114 covers the side surfaces of the first oxide layer 111 and the first oxide semiconductor layer 112. Since the processing is performed in such a manner, the end portion of the first oxide semiconductor layer 112 is not exposed. Therefore, oxygen detachment from the end portion of the first oxide semiconductor layer 112 can be inhibited, so that generation of oxygen vacancy can be prevented.

The above manufacturing method example can be referred to for the subsequent steps. That is, the first electrode 102a, the second electrode 102b, the gate insulating layer 104, the gate electrode 105, the insulating layer 108, the insulating layer 109, the electrode 106a, and the electrode 106b are sequentially formed by a method similar to that described above.

Through the above process, a transistor 160 can be manufactured (see FIG. 6D).

The transistor 160 is different from the transistor 150 in the shape of the end portion of the oxide stack 110. Specifically, the second oxide semiconductor layer 113 and the second oxide layer 114 are provided to cover the end portions of the first oxide layer 111 and the first oxide semiconductor layer 112.

The above is the description of the modification example 1.

Modification Example 2

An example of a method for manufacturing a transistor which is partly different from the example of method for manufacturing a transistor and the modification example 1 is described below. Note that different points from those described above are described below, and the common portions may be omitted.

First, in a manner similar to the above manufacturing method, the insulating layer 107, the first oxide layer 111, and the first oxide semiconductor layer 112 are formed over the substrate 101.

Figure 7A:
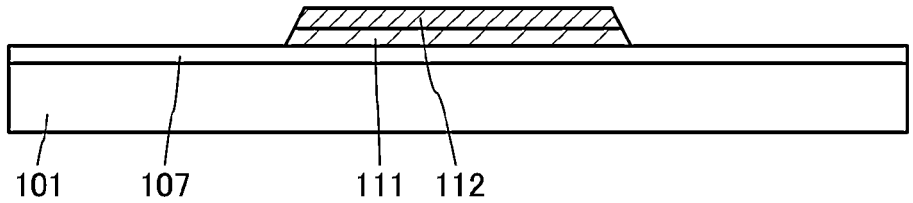
FIGS. 7A to 7D illustrate a example of a method for manufacturing the semiconductor device of the embodiment.

After that, unnecessary portions of the first oxide layer 111 and the first oxide semiconductor layer 112 are etched by a photolithography method or the like, so that the first oxide layer 111 and the first oxide semiconductor layer 112 are processed into an island shape (see FIG. 7A)

Figure 7B:
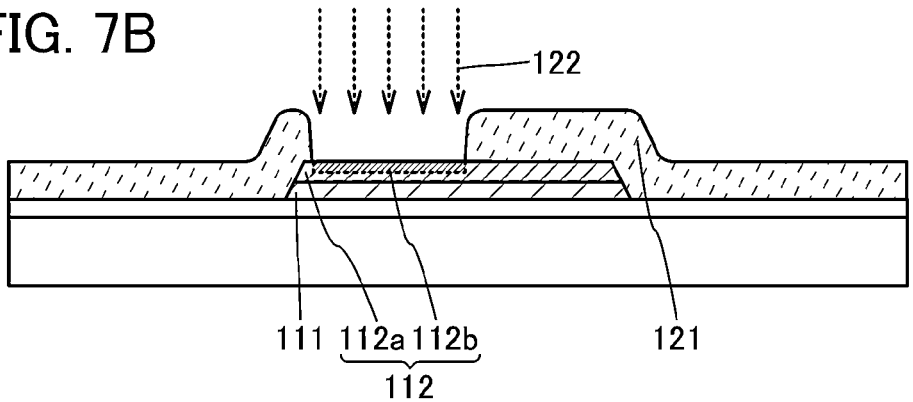

Subsequently, the resist mask 121 is formed over the first oxide semiconductor layer 112. Then, the element 122 is introduced to part of the first oxide semiconductor layer 112 through an opening portion of the resist mask 121, so that the second region 112b containing the element 122 and the first region 112a having a low concentration of the element 122 are formed in the first oxide semiconductor layer 112 (see FIG. 7B).

After the introduction of the element 122, the resist mask 121 is removed.

Figure 7C:
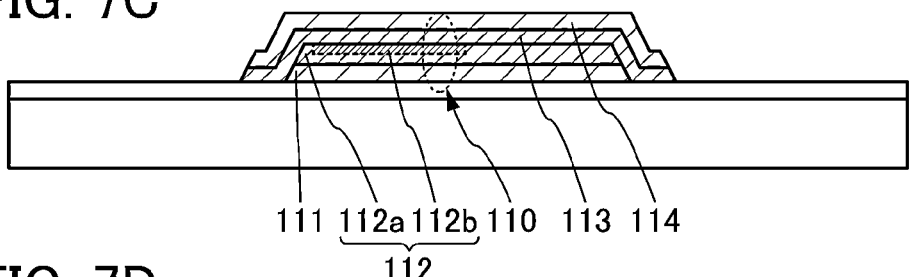

Then, the second oxide semiconductor layer 113 and the second oxide layer 114 are formed to cover the first oxide semiconductor layer 112. After that, unnecessary portions of the second oxide semiconductor layer 113 and the second oxide layer 114 are etched by a photolithography method or the like, so that the second oxide semiconductor layer 113 and the second oxide layer 114 are processed into an island shape (see FIG. 7C).

At this time, in a manner similar to that in Modification example 1, the processing is preferably performed so that the stack including the second oxide semiconductor layer 113 and the second oxide layer 114 covers the side surfaces of the first oxide layer 111 and the first oxide semiconductor layer 112.

The above manufacturing method example can be referred to for the subsequent steps. That is, the first electrode 102a, the second electrode 102b, the gate insulating layer 104, the gate electrode 105, the insulating layer 108, the insulating layer 109, the electrode 106a, and the electrode 106b are sequentially formed by a method similar to that described above.

Figure 7D:
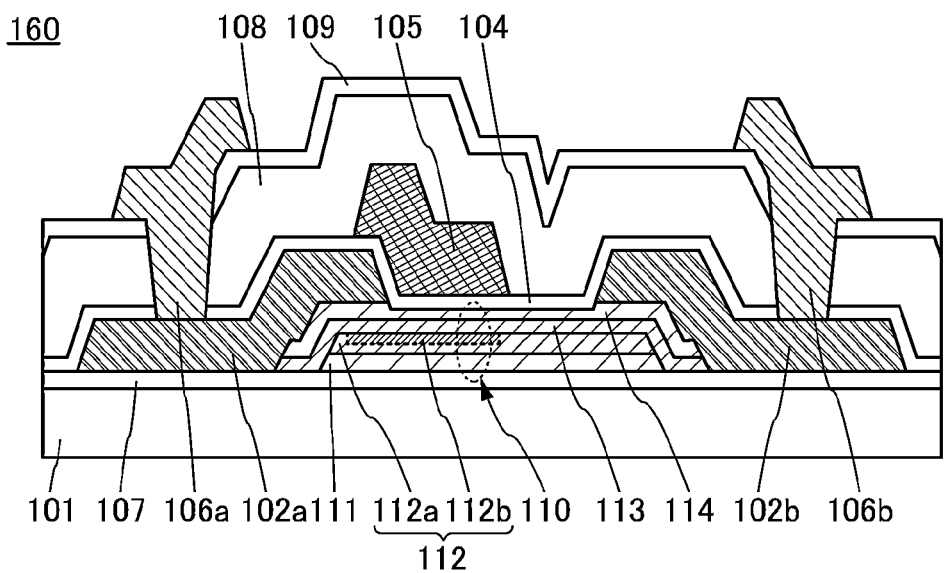

Through the above process, the transistor 160 can be manufactured (see FIG. 7D). The transistor 160 illustrated in FIG. 7D has the same structure as the transistor 160 in FIG. 6D described in Modification example 1.

The above is the description of this modification example.

Modification Example 3

An example of a method for manufacturing a transistor which is partly different from the example of method for manufacturing a transistor and the modification examples is described below. Note that different points from those described above are described below, and the common portions may be omitted.

Figure 8A:
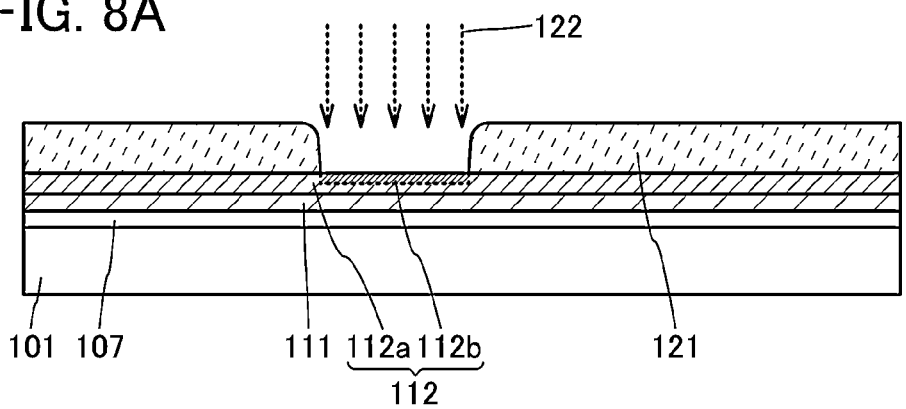
FIGS. 8A to 8D illustrate an example of a method for manufacturing the semiconductor device of the embodiment.

First, in a manner similar to the above manufacturing method, the insulating layer 107, the first oxide layer 111, and the first oxide semiconductor layer 112 are formed over the substrate 101. Subsequently, the resist mask 121 is formed over the first oxide semiconductor layer 112. Then, the element 122 is introduced to part of the first oxide semiconductor layer 112 through an opening portion of the resist mask 121, so that the second region 112b containing the element 122 and the first region 112a having a low concentration of the element 122 are formed in the first oxide semiconductor layer 112 (see FIG. 8A).

After the introduction of the element 122, the resist mask 121 is removed.

Figure 8B:
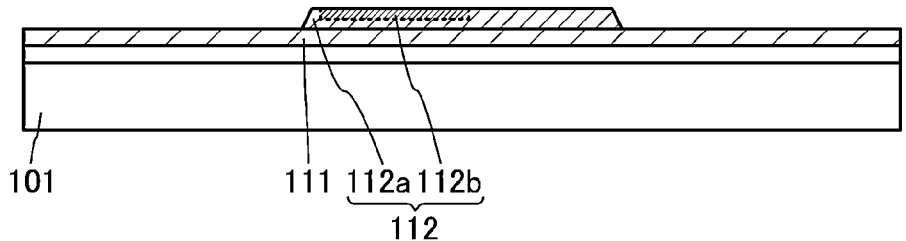

Next, an unnecessary portion of the first oxide semiconductor layer 112 is etched by a photolithography method or the like, whereby the first oxide semiconductor layer 112 is processed into an island shape (see FIG. 8B).

The conditions of the etching of the first oxide semiconductor layer 112 are preferably such that the etching selectivity of the first oxide semiconductor layer 112 to the first oxide layer 111 is high. Note that in the case where the composition of the first oxide layer 111 is close to that of the first oxide semiconductor layer 112 or in the case where the etching selectivity is not high, the first oxide layer 111 might be etched, so that part of the first oxide layer 111 is thinned.

Figure 8C:
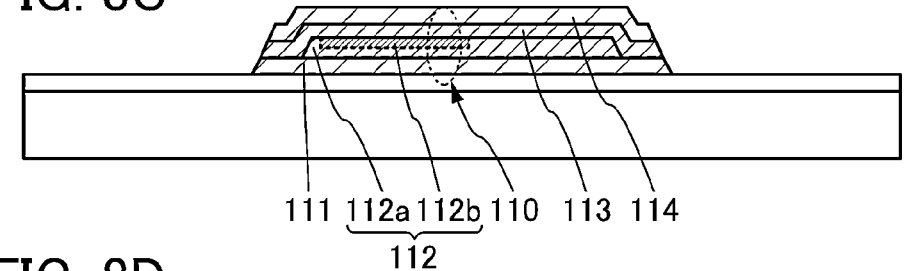

Then, the second oxide semiconductor layer 113 and the second oxide layer 114 are formed to cover the first oxide layer 111 and the first oxide semiconductor layer 112. After that, unnecessary portions of the first oxide layer 111, the second oxide semiconductor layer 113, and the second oxide layer 114 are etched by a photolithography method or the like, so that the first oxide layer 111, the second oxide semiconductor layer 113, and the second oxide layer 114 are processed into an island shape (see FIG. 8C).

At this time, the processing is preferably performed so that the stack including the second oxide semiconductor layer 113 and the second oxide layer 114 covers the side surface of the first oxide semiconductor layer 112. Since the processing is performed in such a manner, the end portion of the first oxide semiconductor layer 112 is not exposed. Therefore, oxygen detachment from the end portion of the first oxide semiconductor layer 112 can be inhibited, so that generation of oxygen vacancy can be prevented.

The above manufacturing method example can be referred to for the subsequent steps. That is, the first electrode 102a, the second electrode 102b, the gate insulating layer 104, the gate electrode 105, the insulating layer 108, the insulating layer 109, the electrode 106a, and the electrode 106b are sequentially formed by a method similar to that described above.

Figure 8D:
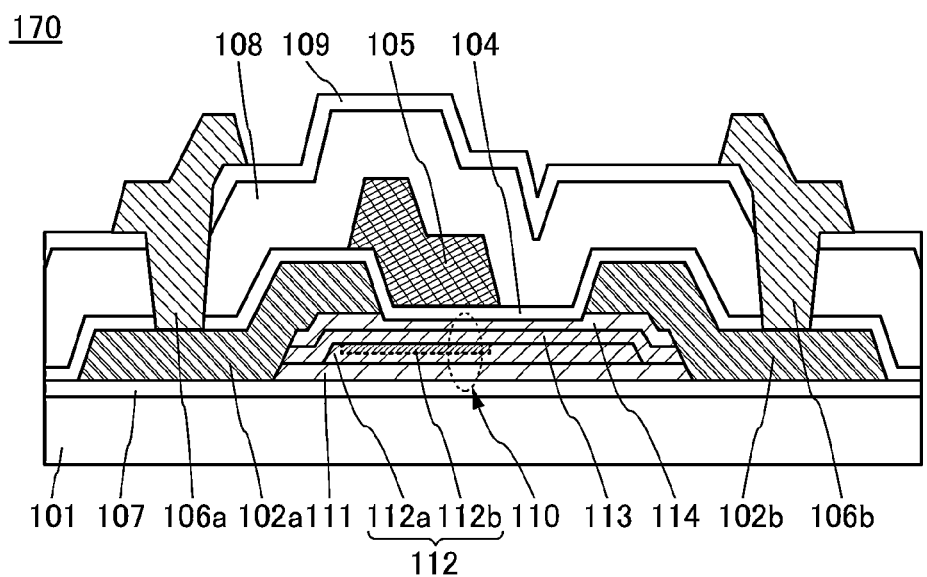

Through the above process, a transistor 170 can be manufactured (see FIG. 8D).

The transistor 170 is different from the transistor 150 and the transistor 160 in the shape of the end portion of the oxide stack 110. Specifically, the second oxide semiconductor layer 113 is provided to cover the end portion of the first oxide semiconductor layer 112 and be in contact with part of the top surface of the first oxide layer 111.

The above is the description of the modification example 3.

Modification Example 4

An example of a method for manufacturing a transistor which is partly different from the example of a method for manufacturing a transistor and the modification examples is described below. Note that different points from those described above are described below, and the common portions may be omitted.

First, in a manner similar to the above manufacturing method, the insulating layer 107, the first oxide layer 111, and the first oxide semiconductor layer 112 are formed over the substrate 101.

Figure 9A:
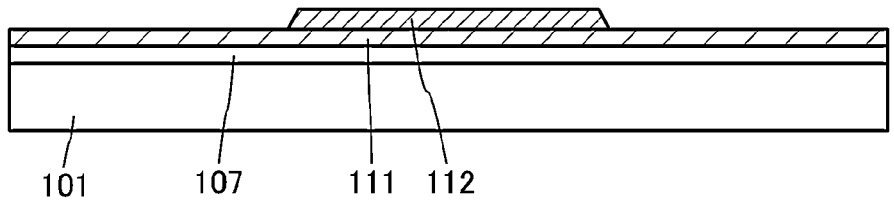
FIGS. 9A to 9D illustrate an example of a method for manufacturing the semiconductor device of the embodiment.

After that, an unnecessary portion of the first oxide semiconductor layer 112 is etched by a photolithography method or the like, so that the first oxide semiconductor layer 112 is processed into an island shape (see FIG. 9A). The modification example 3 can be referred to for the etching.

Figure 9B:
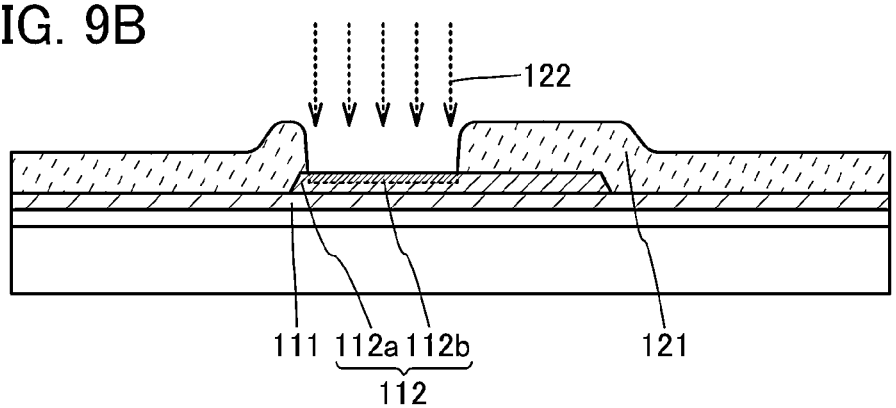
Figure 9C:
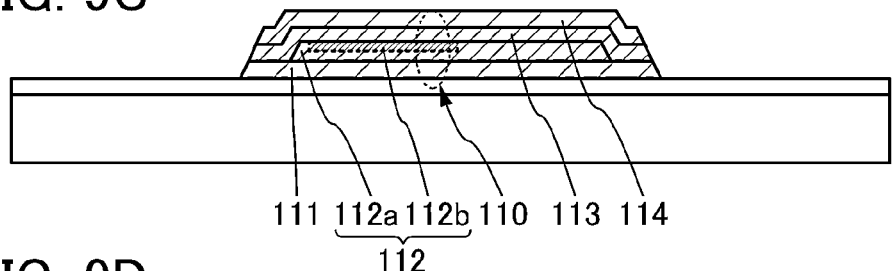

Subsequently, the resist mask 121 is formed over the first oxide layer 111 and the first oxide semiconductor layer 112. Then, the element 122 is introduced to part of the first oxide semiconductor layer 112 through an opening portion of the resist mask 121, so that the second region 112b containing the element 122 and the first region 112a having a low concentration of the element 122 are formed in the first oxide semiconductor layer 112 (see FIG. 9B).

After the introduction of the element 122, the resist mask 121 is removed.

Then, the second oxide semiconductor layer 113 and the second oxide layer 114 are formed to cover the first oxide layer 111 and the first oxide semiconductor layer 112. After that, unnecessary portions of the first oxide layer 111, the second oxide semiconductor layer 113 and the second oxide layer 114 are etched by a photolithography method or the like, so that the first oxide layer 111, the second oxide semiconductor layer 113, and the second oxide layer 114 are processed into an island shape.

At this time, in a manner similar to that in the modification example 3, the processing is preferably performed so that the stack including the second oxide semiconductor layer 113 and the second oxide layer 114 covers the side surface of the first oxide semiconductor layer 112.

The above manufacturing method example can be referred to for the subsequent steps. That is, the first electrode 102a, the second electrode 102b, the gate insulating layer 104, the gate electrode 105, the insulating layer 108, the insulating layer 109, the electrode 106a, and the electrode 106b are sequentially formed by a method similar to that described above.

Figure 9D:
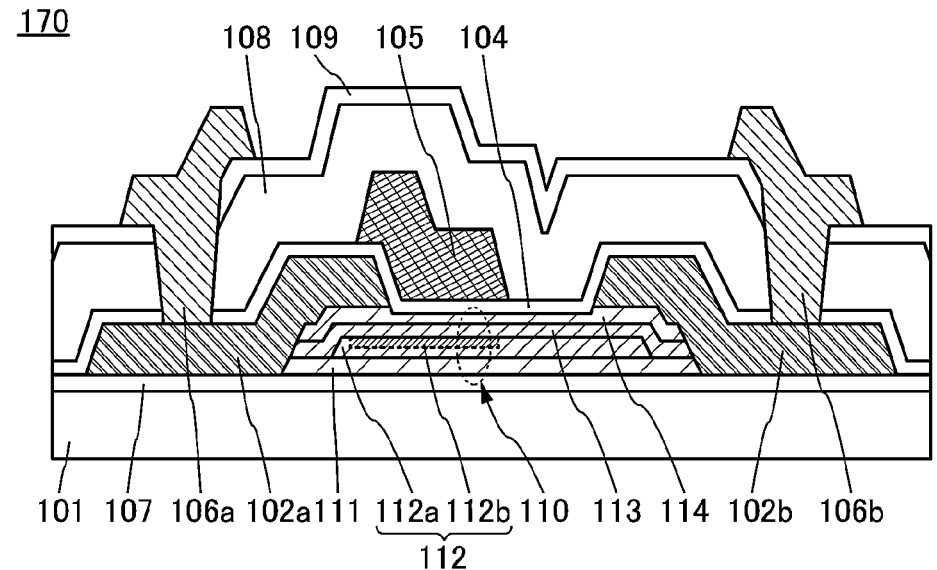

Through the above process, the transistor 170 can be manufactured (see FIG. 9D). Here, the transistor 170 in FIG. 9D has a structure similar to that of the transistor 170 in FIG. 7D described in the modification example 3.

The above is the description of this modification example.

Although various films such as metal films, semiconductor films, and inorganic insulating films described in the above embodiments can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. Note that the chemical formula of trimethylgallium is $Ga(CH_3)_3$. Further, the chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, a $Zn(CH_3)_2$ gas may be used.

This embodiment can be combined with any of the other embodiments disclosed in this specification as appropriate.

Embodiment 2

In this embodiment, a structural example of a semiconductor device and an example of a method for manufacturing a semiconductor device which are different from those of Embodiment 1 are described with reference to drawings. Note that description of the same portions as those in Embodiment 1 is omitted in some cases.

Structural Example 2

Structural Example of Transistor

Figure 10A:
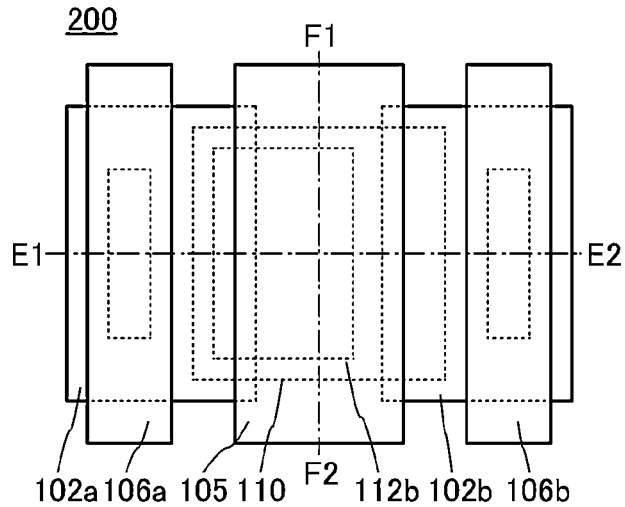
FIGS. 10A to 10C illustrate a structural example of a semiconductor device of an embodiment.
Figure 10C:
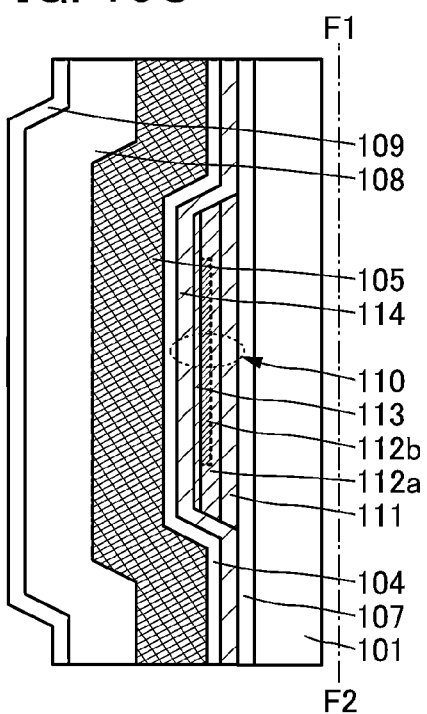
Figure 10B:
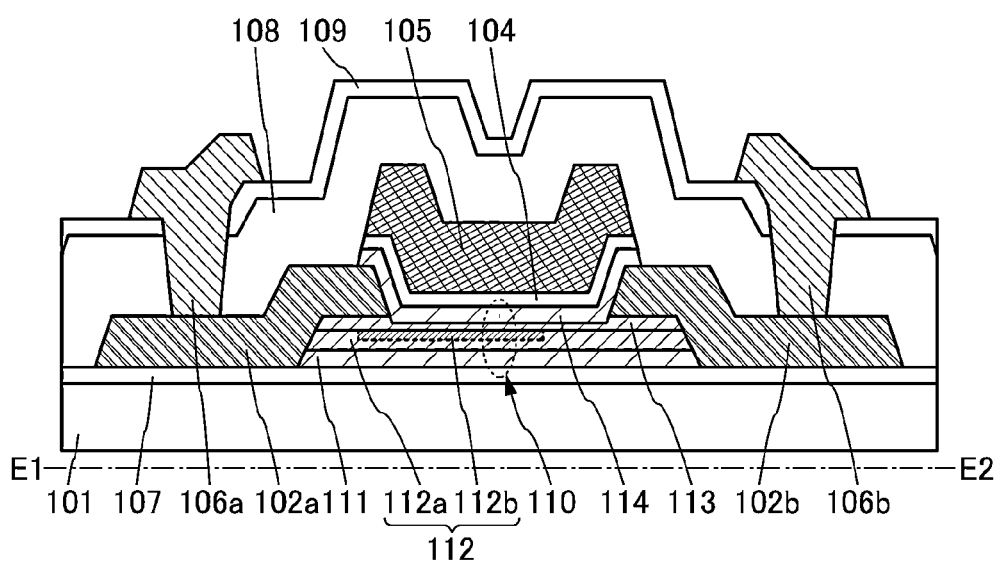

FIGS. 10A to 10C illustrate a transistor 200 that is an example described in this structural example. FIG. 10A is a schematic top view of the transistor 200. FIGS. 10B and 10C are schematic cross-sectional views taken along lines E1-E2 and F1-F2 in FIG. 10A, respectively. Note that FIG. 10A illustrates only main components for simplicity.

The structure illustrated in FIGS. 10A to 10C includes the oxide stack 110 which is provided over the insulating layer 107 provided over the substrate 101. The oxide stack 110 has a stacked-layer structure in which the first oxide layer 111, the first oxide semiconductor layer 112, the second oxide semiconductor layer 113, and the second oxide layer 114 are stacked in this order. The first electrode 102a and the second electrode 102b which are apart from each other are provided over the first oxide semiconductor layer 112 to be in contact with part of the second oxide semiconductor layer 113 and part of the bottom surface of the second oxide layer 114. The gate insulating layer 104 is provided over the second oxide layer 114. The gate electrode 105 which overlaps the oxide stack 110 is provided over the gate insulating layer 104.

The insulating layer 108 is provided to cover and the gate electrode 105. The insulating layer 109 is provided over the insulating layer 108. Further, over the insulating layer 109, the electrode 106a and the electrode 106b which are electrically connected to the first electrode 102a and the second electrode 102b, respectively, are provided in opening portions formed in the insulating layer 109 and the insulating layer 108.

The first oxide semiconductor layer 112 includes the second region 112b which contains an element that imparts conductivity to an oxide semiconductor included in the first oxide semiconductor layer 112, and the first region 112a which has a lower concentration of the element than the second region 112b.

The second region 112b is provided on the inside of the end portions of the first oxide semiconductor layer 112. Further, the second region 112b is provided in the first oxide semiconductor layer 112 so that the bottom and side portions of the second region 112b are surrounded by the first region 112a. The second oxide semiconductor layer 113 is provided over the second region 112b.

Here, the first electrode 102a and the second electrode 102b are each provided in contact with the top surface of the second oxide semiconductor layer 113 where the channel is formed. As a result, series resistance between the source and the drain in the on state can be small as compared to that of the structure in which the second oxide layer 114 is provided between the second oxide semiconductor layer 113 and the first electrode 102a or the second electrode 102b, so that larger current can flow.

To obtain a sufficient distance between the first electrode 102a and the second region 112b so that the first electrode 102a and the second region 112b are not in contact with each other, the thickness of the second oxide semiconductor layer 113 is preferably adjusted. For example, when the thickness of the second oxide semiconductor layer 113 in a region which the first electrode 102a overlaps is greater than or equal to 10 nm and less than or equal to 40 nm, preferably greater than or equal to 20 nm and less than or equal to 40 nm, the on/off operation of the transistor 200 can be secured without sacrifice of on-state current and the normally off transistor 200 can be obtained.

The end portion of the second oxide layer 114 is in contact with the insulating layer 108. Here, in the case where a layer containing excess oxygen is used as the insulating layer 108, oxygen which is released from the insulating layer 108 can be supplied to the second oxide semiconductor layer 113 through the second oxide layer 114 by heat treatment or the like. As a result, oxygen vacancy in the second oxide semiconductor layer 113 or the first oxide semiconductor layer 112 can be reduced. On the other hand, in the case where a layer having a barrier property against oxygen is used as the insulating layer 108, release of oxygen from the end portion of the second oxide layer 114 by heat treatment or the like can be prevented.

Modification Example

A modification example whose structure is partly different from that of the transistor in FIGS. 10A to 10C is described below.

Figure 11:
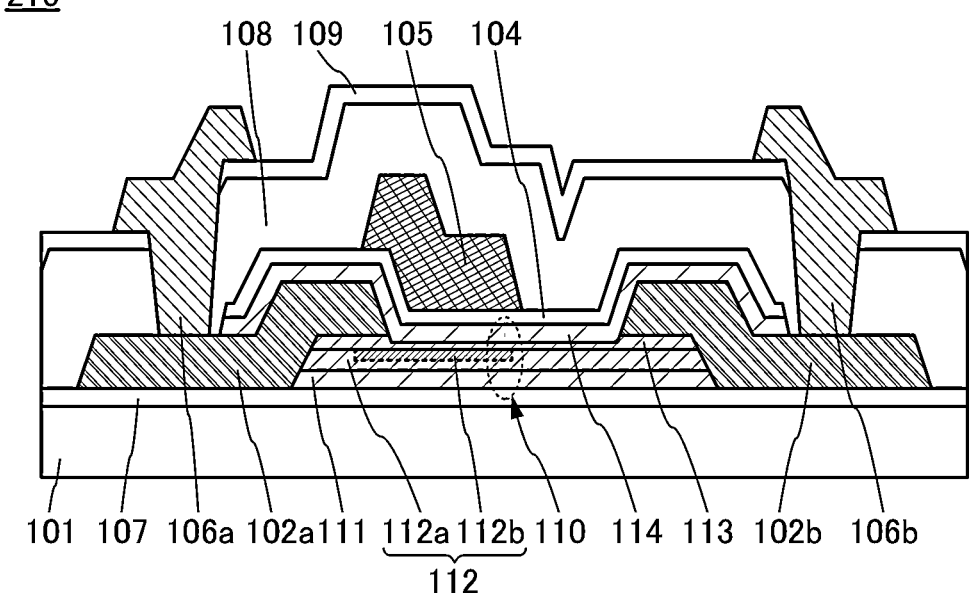
FIG. 11 illustrates a structural example of a semiconductor device of an embodiment.

FIG. 11 illustrates a schematic cross-sectional view of a transistor 210 described in this modification example.

The transistor 210 has the same structure as the transistor 200 illustrated in FIGS. 10A to 10C except the shapes of the gate electrode 105, the gate insulating layer 104, and the second oxide layer 114.

The gate electrode 105 of the transistor 210 overlaps the first electrode 102a and does not overlap the second electrode 102b.

The second electrode 102b that can function as a drain electrode and the gate electrode 105 do not overlap each other to be separated from each other, whereby withstand voltage between the gate and the drain can be improved. Therefore, with such a structure, even when the transistor 210 is driven at an extremely high voltage, high reliability can be ensured.

As illustrated in FIG. 11, it is preferable that an end portion of the second region 112b on the second electrode 102b side in the first oxide semiconductor layer 112 be located on the inside of the gate electrode 105. In other words, the gate electrode 105 preferably extends to be closer to the second electrode 102b than the second region 112b is. Note that an end portion of the gate electrode 105 on the second electrode 102b side may be aligned with the end portion of the second region 112b on the second electrode 102b side.

The n-type second region 112b is provided on the inside of the gate electrode 105, whereby the transistor characteristics can be prevented from becoming normally on. When the length of a portion where the gate electrode 105 and a region between the source and the drain overlap each other is referred to as a gate length, the length in the direction of the source and the drain of a region which is between the source and the drain and where the gate electrode 105 and the second region 112b overlap each other is, for example, less than or equal to the gate length, preferably less than or equal to 0.8 times, further preferably less than or equal to 0.5 times the gate length.

Further, the second oxide layer 114 and the gate insulating layer 104 extend to the outside of the gate electrode 105 to overlap part of the first electrode 102a and part of the second electrode 102b. Such a structure enables the second oxide layer 114 to surely cover the second oxide semiconductor layer 113. As illustrated in FIG. 11, the second oxide layer 114 and the gate insulating layer 104 are processed into an island shape and the end portions thereof are provided to be closer to the gate electrode 105 than the electrode 106a and the electrode 106b are, so that the electrode 106a and the electrode 106b are not in contact with the second oxide layer 114; as a result, oxygen in the second oxide layer 114 can be prevented from being extracted by the electrode 106a and the electrode 106b.

The structure of the modification example can improve the withstand voltage between the gate and the drain, whereby a highly reliable transistor in which higher current can flow can be obtained. Further, a normally-off transistor can be obtained.

The above is the description of this modification example.

Manufacturing Method Example 2

An example of a method for manufacturing the semiconductor device of one embodiment of the present invention is described below with reference to drawings. Note that description of some portions common to those in Embodiment 1 is omitted in some cases.

[Example of Method for Manufacturing Transistor]

An example of a method for manufacturing the transistor 200 described in Structural example 2 is described below.

First, the insulating layer 107, the first oxide layer 111, and the first oxide semiconductor layer 112 are formed over the substrate 101. Subsequently, the resist mask 121 is formed over the first oxide semiconductor layer 112. Then, the element 122 is introduced to part of the first oxide semiconductor layer 112 through an opening portion of the resist mask 121, so that the second region 112b containing the element 122 and the first region 112a having a low concentration of the element 122 are formed in the first oxide semiconductor layer 112. After the introduction of the element 122, the resist mask 121 is removed.

Figure 12A:
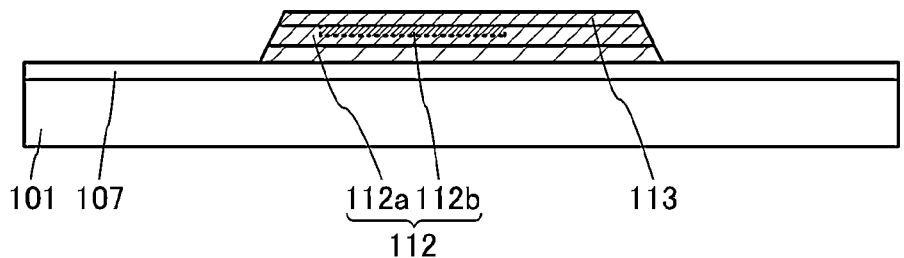
FIGS. 12A to 12D illustrate an example of a method for manufacturing the semiconductor device of the embodiment.

Next, the second oxide semiconductor layer 113 is formed over the first oxide semiconductor layer 112. After that, unnecessary portions of the first oxide layer 111, the first oxide semiconductor layer 112, and the second oxide semiconductor layer 113 are etched by a photolithography method or the like, whereby the first oxide layer 111, the first oxide semiconductor layer 112, and the second oxide semiconductor layer 113 are processed into an island shape (see FIG. 12A).

Figure 12B:
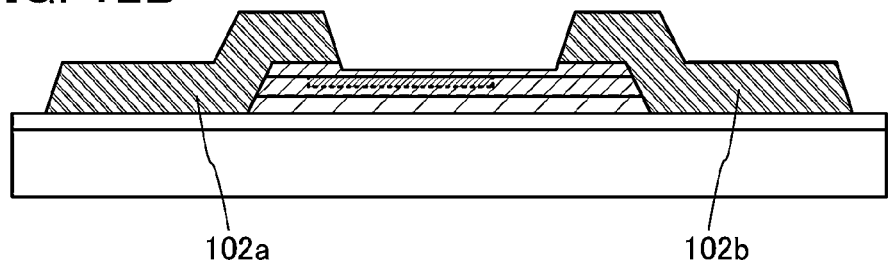

Next, a conductive film is formed over the first oxide layer 111, the first oxide semiconductor layer 112, and the second oxide semiconductor layer 113, and an unnecessary portion is etched to form the first electrode 102a and the second electrode 102b (see FIG. 12B).

At the time of etching the conductive film, an upper portion of the second oxide semiconductor layer 113 might be etched, so that part of the second oxide semiconductor layer 113 might be thinned or disappear. Therefore, the thickness of the second oxide semiconductor layer 113 at the time of the formation is preferably set in consideration of influence by the etching.

When dry etching is used for the etching of the conductive film, an etching residue might remain on the surfaces of the first oxide layer 111, the first oxide semiconductor layer 112, the second oxide semiconductor layer 113, and the insulating layer 107. In such a case, cleaning treatment is preferably performed to remove the etching residue. A short circuit of the first electrode 102a and the second electrode 102b can be suppressed by the cleaning treatment. The cleaning treatment can be performed using an alkaline solution such as a tetramethylammonium hydroxide (TMAH) solution, an acidic solution such as diluted hydrofluoric acid, an oxalic acid solution, or a phosphorus acid solution.

In particular, when an etching residue remains on the surface of the second oxide semiconductor layer 113, an unintended interface state is formed at the interface between the second oxide semiconductor layer 113 and the second oxide layer 114 to be formed later, so that the electrical characteristics and reliability of the transistor are adversely affected. Therefore, performing the cleaning treatment is particularly effective.

Figure 12C:
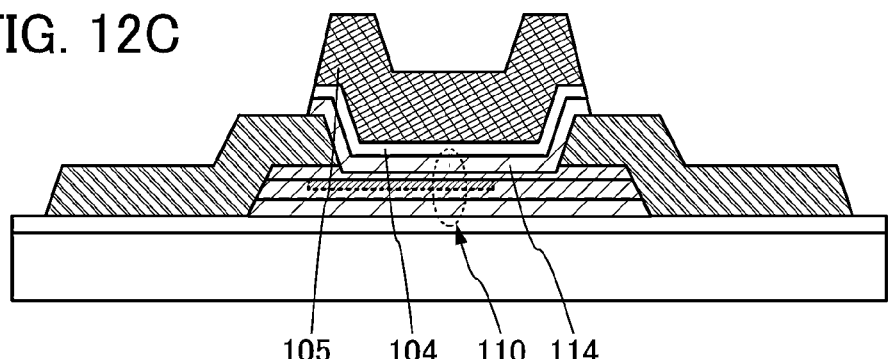

Next, the second oxide layer 114, the gate insulating layer 104, and a conductive film are sequentially formed. After that, unnecessary portions of the second oxide layer 114, the gate insulating layer 104, and the conductive film are etched by a photolithography method or the like to form the second oxide layer 114, the gate insulating layer 104, and the gate electrode 105 processed into the same pattern (see FIG. 12C).

Here, the second oxide layer 114, the gate insulating layer 104, and the gate electrode 105 may be processed using the same resist mask. Alternatively, the resist mask may be removed after the gate electrode 105 is formed, and then the second oxide layer 114 and the gate insulating layer 104 may be processed using the gate electrode 105 as an etching mask (also referred to as a hard mask). In any case, the second oxide layer 114, the gate insulating layer 104, and the gate electrode 105 can be formed using one mask. Therefore, for example, the processing can be performed using the method described in the manufacturing method example 1 of Embodiment 1 without an increase in the number of photomasks.

Embodiment 1 can be referred to for the subsequent steps. In other words, the insulating layer 108, the insulating layer 109, the electrode 106a, and the electrode 106b are successively formed using a method similar to that described above.

Figure 12D:
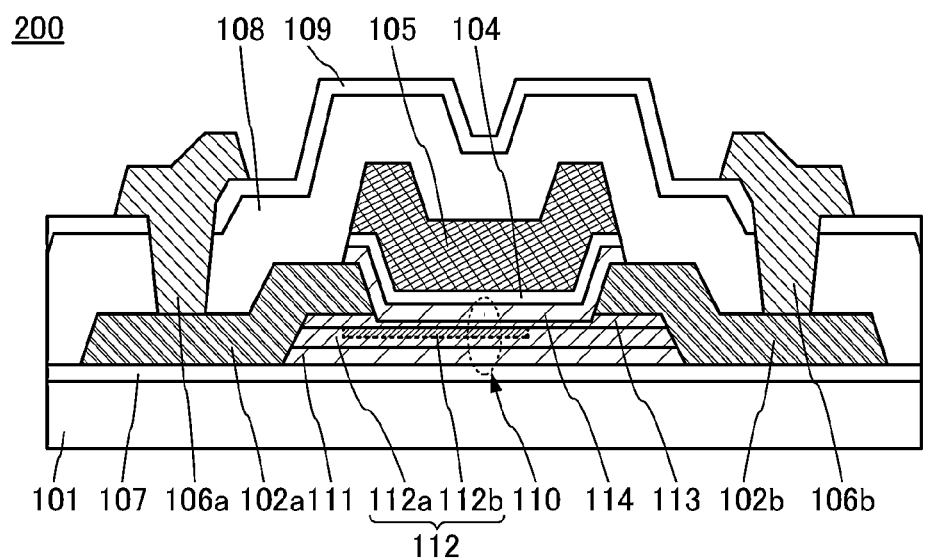

Through the above process, the transistor 200 can be manufactured (see FIG. 12D).

Note that after the element 122 is introduced, the first oxide layer 111 and the first oxide semiconductor layer 112 may be processed into an island shape, and then the second oxide semiconductor layer 113 may be deposited and processed into an island shape so as to cover the end portions of the first oxide layer 111 and the first oxide semiconductor layer 112.

Alternatively, after the element 122 is introduced, only the first oxide semiconductor layer 112 may be processed into an island shape, then the second oxide semiconductor layer 113 is deposited, and the second oxide semiconductor layer 113 and the first oxide layer 111 may be processed into an island shape so as to surround the first oxide semiconductor layer 112.

In the case where the transistor 210 illustrated in FIG. 11 is formed, the stack including the second oxide semiconductor layer 113 and the gate insulating layer 104, and the gate electrode 105 can be formed by be processed separately. For example, after the second oxide semiconductor layer 113 and the gate insulating layer 104 are processed, a conductive film to be the gate electrode 105 is formed and processed to form the gate electrode 105. Alternatively, the second oxide semiconductor layer 113, the gate insulating layer 104, and a conductive film to be the gate electrode 105 are formed, the conductive film is processed into the gate electrode 105, and then the second oxide semiconductor layer 113 and the gate insulating layer 104 may be processed. In this case, the process may be performed using a half-tone mask (also referred to as a gray-tone mask).

The above is the description of the manufacturing method example 2.

Embodiment 3

In this embodiment, configuration examples of power converter circuits such as an inverter and an converter each including the transistor described in the above embodiment are described as an example of a semiconductor device that is one embodiment of the present invention.

[DC-DC Converter]

Figure 14A:
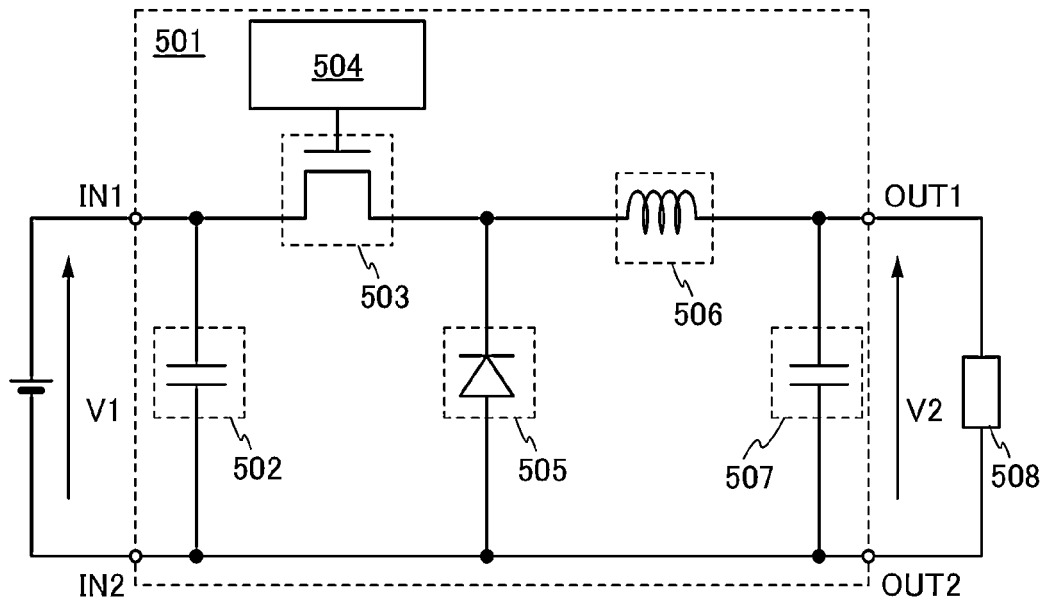
FIGS. 14A and 14B each illustrate a configuration example of a power converter circuit of an embodiment.

A DC-DC converter 501 in FIG. 14A is an example of a step-down DC-DC converter using a chopper circuit. The DC-DC converter 501 includes a capacitor 502, a transistor 503, a control circuit 504, a diode 505, a coil 506, and a capacitor 507.

The DC-DC converter 501 is operated by a switching operation of the transistor 503 with the control circuit 504. By the DC-DC converter 501, an input voltage V1 applied to input terminals IN1 and IN2 can be output from output terminals OUT1 and OUT2 to a load 508 as a voltage V2 which is stepped down. The semiconductor device described in the above embodiment can be applied to the transistor 503 included in the DC-DC converter 501. Therefore, large output current can flow through the DC-DC converter 501 by the switching operation, and off-state current can be reduced. Therefore, the DC-DC converter consumes less power and can operate at high speed.

Although the step-down DC-DC converter using a chopper circuit is shown in FIG. 14A as an example of a non-isolated power converter circuit, the semiconductor device described in the above embodiment can also be applied to a transistor included in a step-up DC-DC converter using a chopper circuit or a step-up/step-down DC-DC converter using a chopper circuit. Therefore, large output current can flow through the DC-DC converter by the switching operation, and off-state current can be reduced. Therefore, the DC-DC converter consumes less power and can operate at high speed.

Figure 14B:
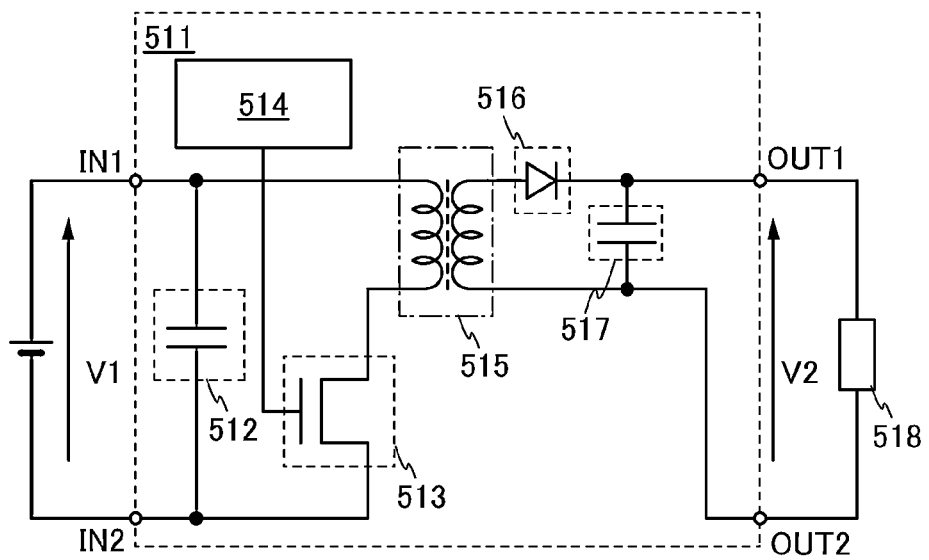

Next, a DC-DC converter 511 illustrated in FIG. 14B is an example of a fly-back converter which is an isolated power converter circuit. The DC-DC converter 511 includes a capacitor 512, a transistor 513, a control circuit 514, a transformer 515 including a primary coil and a secondary coil, a diode 516, and a capacitor 517.

The DC-DC converter 511 in FIG. 14B is operated by a switching operation of the transistor 513 with the control circuit 514. By the DC-DC converter 511, an input voltage V1 applied to input terminals IN1 and IN2 can be output from output terminals OUT1 and OUT2 to a load 518 as a voltage V2 which is stepped up or stepped down. The semiconductor device described in the above embodiment can be applied to the transistor 513 included in the DC-DC converter 511. Therefore, large output current can flow through the DC-DC converter 511 by the switching operation, and off-state current can be reduced. Therefore, the DC-DC converter consumes less power and can operate at high speed.

Note that the semiconductor device described in the above embodiment can also be applied to a transistor included in a forward DC-DC converter.

Figure 15:
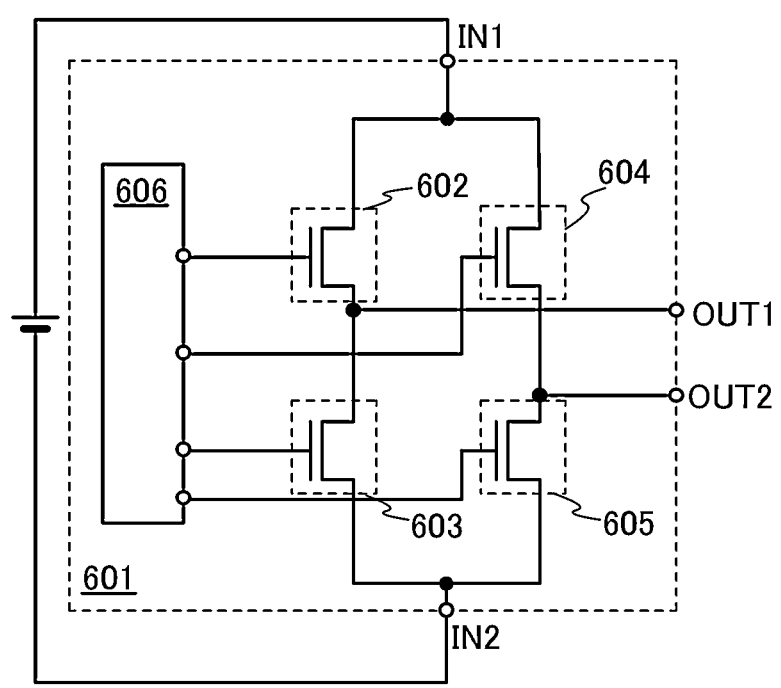
FIG. 15 illustrates a configuration example of a power converter circuit of an embodiment.

An inverter 601 in FIG. 15 is an example of a full-bridge inverter. The inverter 601 includes a transistor 602, a transistor 603, a transistor 604, a transistor 605, and a control circuit 606.

The inverter 601 in FIG. 15 is operated by a switching operation of the transistors 602 to 605 with the control circuit 606. A direct-current voltage V1 applied to input terminals IN1 and IN2 can be output from output terminals OUT1 and OUT2 as an alternating-current voltage V2. The semiconductor device described in the above embodiment can be applied to the transistors 602 to 605 included in the inverter 601. Therefore, large output current can flow through the inverter 601 by the switching operation, and off-state current can be reduced. Therefore, the inverter consumes less power and can operate at high speed.

This embodiment can be combined with any of the other embodiments disclosed in this specification as appropriate.

Embodiment 4

In this embodiment, a configuration example of a power supply circuit including the transistor described in the above embodiment is described as an example of a semiconductor device of one embodiment of the present invention.

Figure 16:
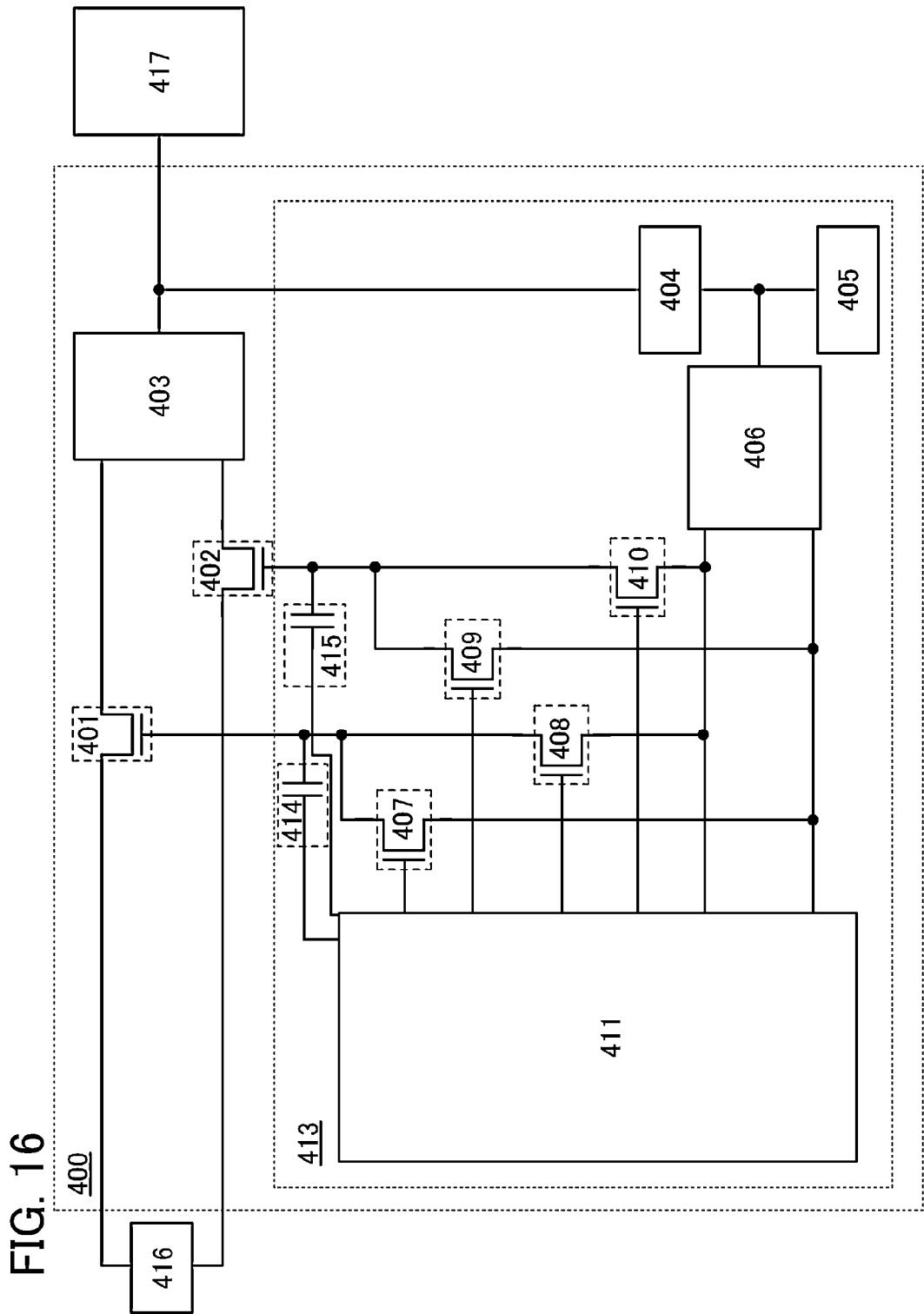
FIG. 16 illustrates a configuration example of a power supply circuit of an embodiment.

FIG. 16 illustrates a configuration example of a power supply circuit 400 of one embodiment of the present invention. The power supply circuit 400 in FIG. 16 includes a control circuit 413, a power switch 401, a power switch 402, and a voltage regulator 403.

Voltage is supplied from a power supply 416 to the power supply circuit 400. The power switches 401 and 402 each have a function of controlling input of the voltage to the voltage regulator 403.

Note that in the case where the voltage output from the power supply 416 is AC voltage, as illustrated in FIG. 16, the power switch 401 controlling input of a first potential to the voltage regulator 403 and the power switch 402 controlling input of a second potential to the voltage regulator 403 are provided in the power supply circuit 400. In the case where the voltage output from the power supply 416 is DC voltage, as illustrated in FIG. 16, the power switch 401 controlling input of the first potential to the voltage regulator 403 and the power switch 402 controlling input of the second potential to the voltage regulator 403 may be provided in the power supply circuit 400; alternatively, the second potential may be a ground potential, the power switch 402 controlling input of the second potential to the voltage regulator 403 may be eliminated, and the power switch 401 controlling input of the first potential to the voltage regulator 403 may be provided in the power supply circuit 400.

In one embodiment of the present invention, a transistor having high withstand voltage is used as each of the power switches 401 and 402. For example, the transistor described in Embodiment 1 can be used for the transistor.

When the oxide semiconductor film having the crystalline structure is used for the power switches 401 and 402, high output current can flow through the power switches 401 and 402 and the power switches 401 and 402 can each have high withstand voltage.

The use of a field-effect transistor including the above transistor material in an active layer as the power switch 401 or 402 can achieve high-speed switching of the power switch 401 or 402, compared with a field-effect transistor including silicon carbide or gallium nitride in an active layer. Consequently, power loss due to the switching can be reduced.

The voltage regulator 403 has a function of regulating voltage input from the power supply 416 through the power switches 401 and 402. Specifically, voltage regulation in the voltage regulator 403 means any one or more of conversion of AC voltage into DC voltage, change of a voltage level, smoothing of a voltage level, and the like.

Voltage regulated in the voltage regulator 403 is applied to a load 417 and the control circuit 413.

In addition, the power supply circuit 400 in FIG. 16 includes a power storage device 404, an auxiliary power supply 405, a voltage generation circuit 406, transistors 407 to 410, and capacitors 414 and 415.

The power storage device 404 has a function of temporarily storing power supplied from the voltage regulator 403. Specifically, the power storage device 404 includes a power storage portion such as a capacitor or a secondary battery that can store power with the use of voltage applied from the voltage regulator 403.

The auxiliary power supply 405 has a function of compensating for the lack of power output from the power storage device 404 for operation of the control circuit 413. A primary battery or the like can be used as the auxiliary power supply 405.

The voltage generation circuit 406 has a function of generating voltage for controlling switching of the power switches 401 and 402 with the use of voltage output from the power storage device 404 or the auxiliary power supply 405. Specifically, the voltage generation circuit 406 has a function of generating voltage for turning on the power switches 401 and 402 and a function of generating voltage for turning off the power switches 401 and 402.

A wireless signal input circuit 411 has a function of controlling the power switches 401 and 402 in accordance with switching of the transistors 407 to 410.

Specifically, the wireless signal input circuit 411 includes an input portion that converts an instruction superimposed on a wireless signal given from the outside to control the operating states of the power switches 401 and 402 into an electric signal, and a signal processor that decodes the instruction included in the electric signal and generates a signal for controlling the switching of the transistors 407 to 410 in accordance with the instruction.

The transistors 407 to 410 switch in accordance with the signal generated in the wireless signal input circuit 411. Specifically, when the transistors 408 and 410 are on, the voltage for turning on the power switches 401 and 402 that is generated in the voltage generation circuit 406 is applied to the power switches 401 and 402. When the transistors 408 and 410 are off, the voltage for turning on the power switches 401 and 402 is continuously applied to the power switches 401 and 402. Further, when the transistors 407 and 409 are on, the voltage for turning off the power switches 401 and 402 that is generated in the voltage generation circuit 406 is applied to the power switches 401 and 402. When the transistors 408 and 410 are off, the voltage for turning off the power switches 401 and 402 is continuously applied to the power switches 401 and 402.

In one embodiment of the present invention, a transistor with extremely low off-state current is used as each of the transistors 407 to 410 so that the voltage is continuously applied to the power switches 401 and 402. With this structure, even when generation of the voltage for determining the operating states of the power switches 401 and 402 in the voltage generation circuit 406 is stopped, the operating states of the power switches 401 and 402 can be kept. Thus, the power consumption of the voltage generation circuit 406 is reduced, so that the power consumption of the power supply circuit 400 can be reduced.

Note that the transistors 407 to 410 may be provided with back gates, which are supplied with a potential, in order to control the threshold voltages of the transistors 407 to 410.

Since a transistor including a wide-gap semiconductor whose bandgap is two or more times that of silicon in an active layer has extremely low off-state current, the transistor is preferably used as each of the transistors 407 to 410. For example, an oxide semiconductor or the like can be used as the wide-gap semiconductor.

Note that a highly purified oxide semiconductor (purified OS) obtained by reduction of impurities such as moisture or hydrogen which serves as an electron donor (donor) and by reduction of oxygen vacancies is an intrinsic (i-type) semiconductor or a substantially i-type semiconductor. Accordingly, with the use of an oxide semiconductor film that is highly purified by sufficiently reducing the concentration of impurities such as moisture or hydrogen and by reducing oxygen vacancy, the off-state current of the transistor can be reduced. Consequently, the use of a transistor including a highly purified oxide semiconductor film as each of the transistors 407 to 410 reduces the power consumption of the voltage generation circuit 406, so that the effect of reducing the power consumption of the power supply circuit 400 can be increased.

A variety of experiments can prove a low off-state current of a transistor including a highly purified oxide semiconductor for a channel formation region. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In this case, it is found that the off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it was found that, in the case where the voltage between the source electrode and the drain electrode of the transistor is 3 V, a lower off-state current of several tens of yA/μm is obtained. Accordingly, the off-state current of the transistor in which the highly purified oxide semiconductor film is used as a channel formation region is considerably lower than that of a transistor in which silicon having crystallinity is used.

Among the oxide semiconductors, unlike silicon carbide or gallium nitride, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide or gallium nitride, the oxide semiconductor (the In—Ga—Zn-based oxide) can be deposited even at room temperature; thus, a transistor with favorable electrical characteristics can be formed over a glass substrate or an integrated circuit using silicon. Further, a larger substrate can be used.

Figure 17:
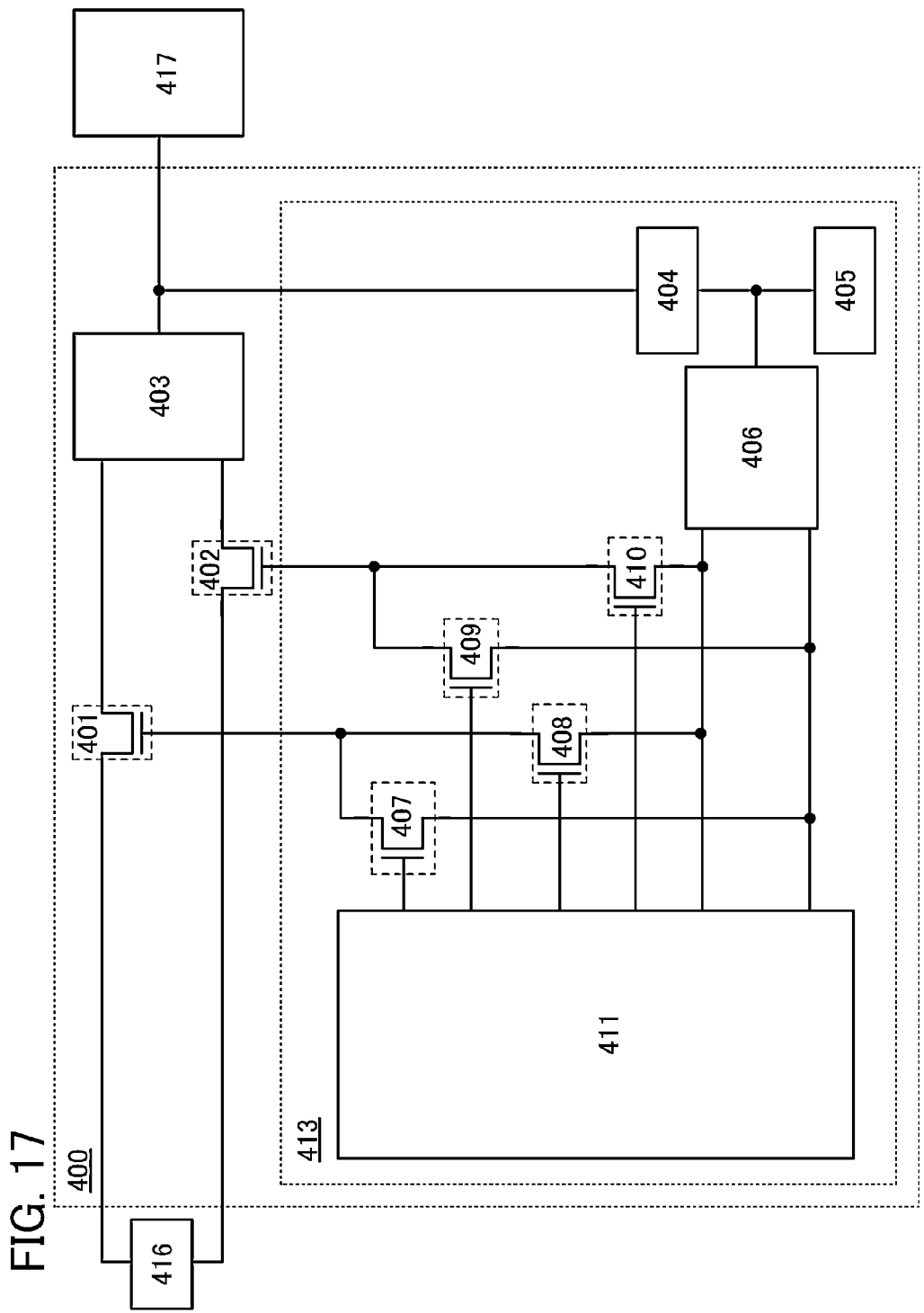
FIG. 17 illustrates a configuration example of a power supply circuit of an embodiment.

The capacitor 414 has a function of holding voltage applied to the power switch 401 when the transistors 407 and 408 are off. The capacitor 415 has a function of holding voltage applied to the power switch 402 when the transistors 409 and 410 are off. One of a pair of electrodes of each of the capacitors 414 and 415 is connected to the wireless signal input circuit 411. Note that as illustrated in FIG. 17, the capacitors 414 and 415 are not necessarily provided.

When the power switches 401 and 402 are on, voltage is supplied from the power supply 416 to the voltage regulator 403. In addition, with the voltage, power is stored in the power storage device 404.

When the power switches 401 and 402 are off, supply of voltage from the power supply 416 to the voltage regulator 403 is stopped. Thus, although power is not supplied to the power storage device 404, the control circuit 413 can be operated using power stored in the power storage device 404 or the auxiliary power supply 405 in one embodiment of the present invention, as described above. In other words, in the power supply circuit 400 according to one embodiment of the present invention, supply of voltage to the voltage regulator 403 can be stopped while the operating states of the power switches 401 and 402 are controlled by the control circuit 413. By stopping the supply of voltage to the voltage regulator 403, it is possible to prevent power consumption due to charging and discharging of the capacitance of the voltage regulator 403 when voltage is not supplied to the load 417. Consequently, the power consumption of the power supply circuit 400 can be reduced.

Embodiment 5

A semiconductor device (including a power converter circuit and a power supply circuit) of one embodiment of the present invention is suitable for controlling supply of power to a device and favorably used particularly for a device that needs large power. For example, the semiconductor device can be favorably used for a device provided with a driver portion whose driving is controlled with power of a motor or the like and a device that controls heating or cooling by power.

Electronic appliances in which the semiconductor device of one embodiment of the present invention can be used are display devices, personal computers, image reproducing devices provided with recording media (typically, devices which reproduce the content of recording media such as digital versatile discs (DVDs) and have displays for displaying the reproduced images), and the like. Further, as electronic appliances in which the semiconductor device of one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, high-frequency heating apparatuses such as microwave ovens, electric rice cookers, electric washing machines, electric fans, driers, air-conditioning systems such as air conditioners, raising and lowering devices such as elevators and escalators, electric refrigerators, electric freezers, electric refrigerator-freezers, electric sewing machines, electric tools, semiconductor testing devices, and the like can be given. The semiconductor device of one embodiment of the present invention may be used for a moving object powered by an electric motor. The moving object is a motor vehicle (a motorcycle or an ordinary motor vehicle with three or more wheels), a motor-assisted bicycle including an electric bicycle, an airplane, a vessel, a rail car, or the like. Further, the semiconductor device can be used for controlling driving of industrial robots used in a variety of fields, e.g., industries of food, home electric appliances, the moving objects, steel, semiconductor devices, civil engineering, architecture, and construction.

Specific examples of these electronic appliances are illustrated in FIGS. 18A to 18D.

Figure 18A:
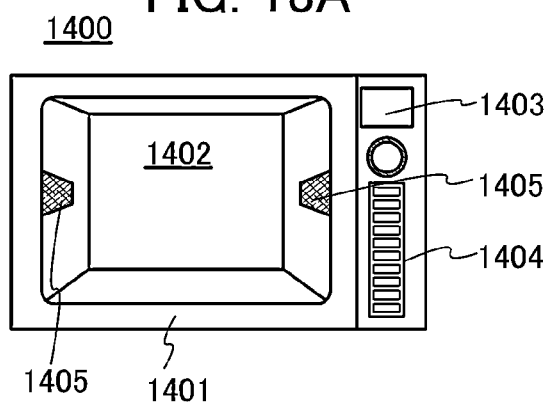
FIGS. 18A to 18D each illustrate an electronic appliance of an embodiment.

FIG. 18A illustrates a microwave oven 1400, which includes a housing 1401, a treatment room 1402 for placing an object, a display portion 1403, an input device (e.g., an operating panel) 1404, and an irradiation portion 1405 supplying an electromagnetic wave generated from a high-frequency wave generator provided in the housing 1401 to the treatment room 1402.

The semiconductor device of one embodiment of the present invention can be used, for example, in a power supply circuit that controls supply of power to the high-frequency wave generator.

Figure 18B:
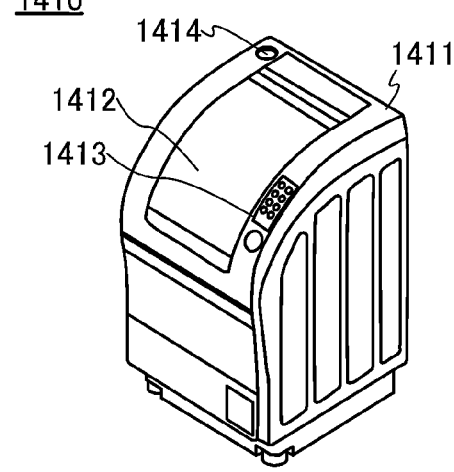

FIG. 18B illustrates a washing machine 1410, which includes a housing 1411, an open/close portion 1412 for opening or closing a washing tub provided in the housing 1411, an input device (e.g., an operating panel) 1413, and a water inlet 1414 of the washing tub.

The semiconductor device of one embodiment of the present invention can be used, for example, in a circuit that controls supply of power to a motor controlling rotation of the washing tub.

Figure 18C:
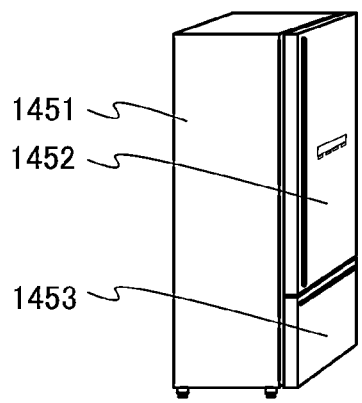

FIG. 18C is an example of an electric refrigerator-freezer. The electronic appliance illustrated in FIG. 18C includes a housing 1451, a refrigerator door 1452, and a freezer door 1453.

In the electronic appliance illustrated in FIG. 18C, the semiconductor device that is one embodiment of the present invention is provided inside the housing 1451. With this structure, supply of a power voltage to the semiconductor device in the housing 1451 can be controlled in accordance with the temperature inside the housing 1451 or in response to opening and closing of the refrigerator door 1452 and the freezer door 1453, for example.

Figure 18D:
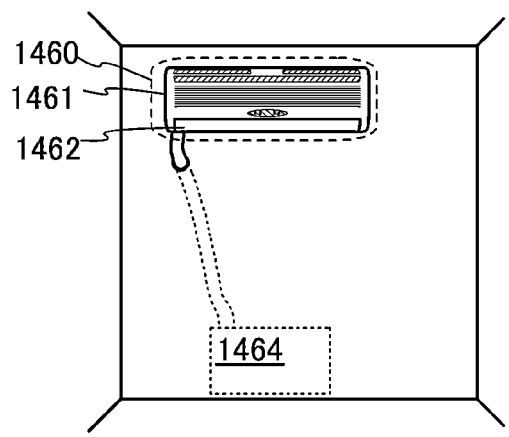

FIG. 18D illustrates an example of an air conditioner. The electronic appliance illustrated in FIG. 18D includes an indoor unit 1460 and an outdoor unit 1464.

The indoor unit 1460 includes a housing 1461 and a ventilation duct 1462.

In the electronic appliance illustrated in FIG. 18D, the semiconductor device that is one embodiment of the present invention is provided inside the housing 1461. With this structure, supply of a power supply voltage to the semiconductor device in the housing 1461 can be controlled in response to a signal from a remote controller or in accordance with the indoor temperature or humidity, for example.

The semiconductor device of one embodiment of the present invention can be used, for example, in a circuit that controls supply of power to a motor controlling rotation of a fan included in the outdoor unit 1464.

Note that the split-type air conditioner including the indoor unit and the outdoor unit is shown in FIG. 18D as an example; alternatively, an air conditioner may be such that the functions of an indoor unit and an outdoor unit are integrated in one housing.

This embodiment can be combined with any of the other embodiments disclosed in this specification as appropriate.

Example

In this example, the band structure of an oxide stack was examined.
[Energy Gap]
First, samples were formed in such a manner that ions were implanted to oxide semiconductor films under different conditions, and the energy gap in each sample was measured.
[Formation of Sample]
A quartz substrate was used as a substrate of each sample. An oxide semiconductor film having a thickness of about 100 nm was deposited over the surface of the substrate. The oxide semiconductor film was deposited by a sputtering method using a polycrystalline sputtering target having an atomic ratio of In:Ga:Zn=1:1:1.

Then, phosphorus was implanted to the oxide semiconductor film by an ion implantation method. The following conditions were used for the implantation of phosphorus: three conditions of the accelerating voltage, i.e., 10 kV, 20 kV, and 30 kV were used; and seven conditions of the dosage of phosphorus, i.e., $1\times10^{12}$ cm$^{-2}$, $1\times10^{13}$ cm$^{-2}$, $1\times10^{14}$ cm$^{-2}$, $5\times10^{14}$ cm$^{-2}$, $1\times10^{15}$ cm$^{-2}$, $3\times10^{15}$ cm$^{-2}$, and $5\times10^{15}$ cm$^{-2}$ were used.
[Evaluation by Ellipsometry]
The band gap of each of the formed samples was calculated by ellipsometry. Here, as the oxide semiconductor film, a stacked-layer structure in which a first layer (L1) that was not doped with phosphorus and a second layer (L2) that was doped with phosphorus were stacked from the substrate side is assumed. The relation between the condition of ion implantation and the thickness of the second layer (L2) is shown in graphs in the upper section of FIG. 21 and the relation between the condition of ion implantation and the band gap of the second layer (L2) is shown in graphs in the lower section of FIG. 21.

Figure 21:
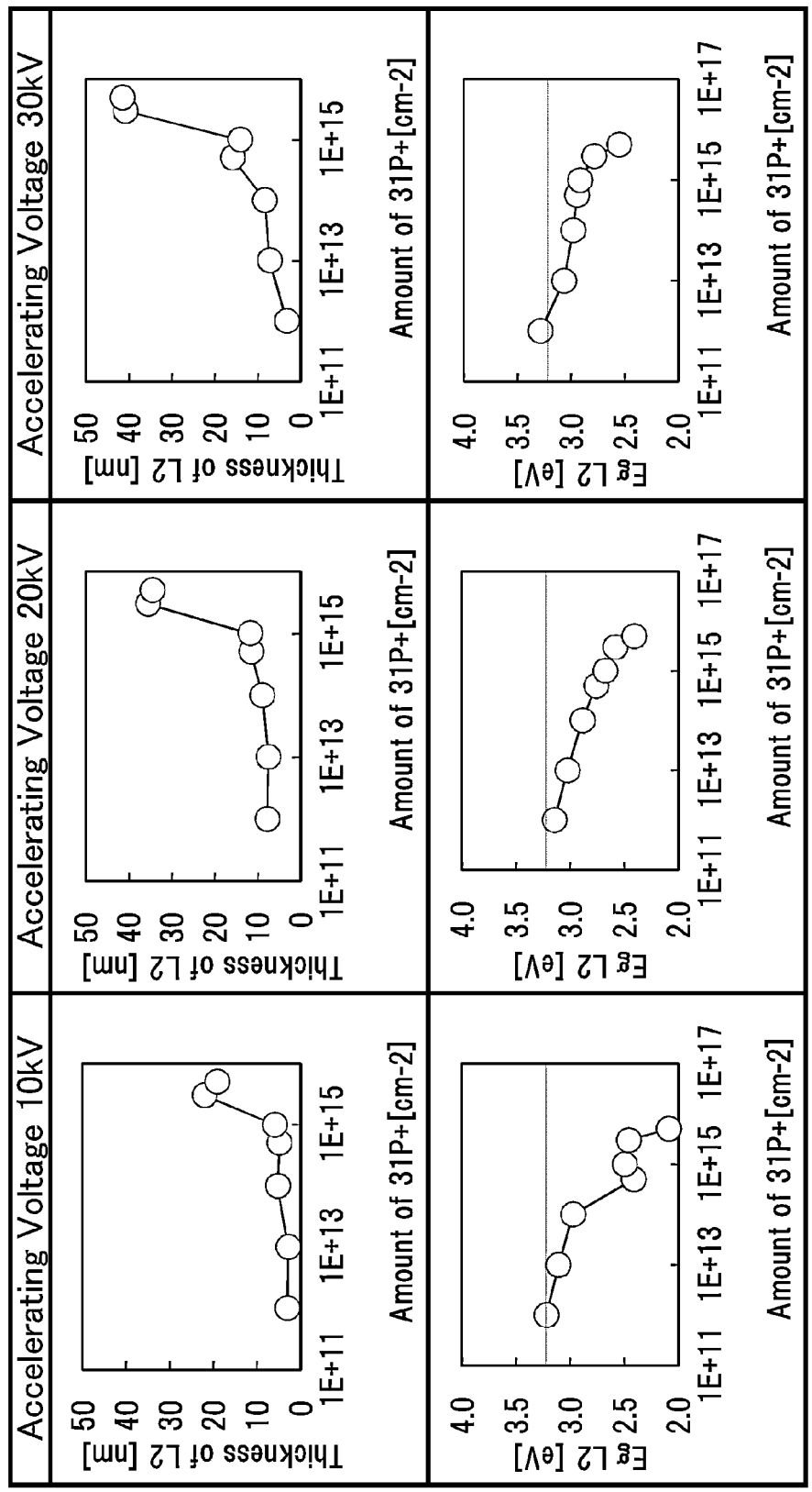
FIG. 21 shows measurement results of the depth and the band gap of a low-resistance region of an example.

A dashed line in each graph in the lower section of FIG. 21 denotes the band gap (3.22 eV) in the sample that is not doped with phosphorus.

The graphs in the upper section of FIG. 21 show that as the accelerating voltage is increased and the amount of implanted ions is increased, a region whose resistance is reduced by the doping with phosphorus tends to expand in the depth direction.

The graphs in the lower section of FIG. 21 show that as the amount of implanted ions is increased, the band gap tends to be reduced. Further, it is found that as the accelerating voltage is reduced, distribution in the depth direction is reduced, and as a result, the amount of change in band gap with respect to the amount of implanted ions tends to increase.
[Band Structure]
A sample different from those described above was formed and evaluated by ultraviolet photoemission spectroscopy (UPS).
[Formation of Sample]
A silicon wafer was used as a substrate of the sample. First, an oxide film on the silicon substrate was removed by dilute hydrofluoric acid, and then a first oxide film having a thickness of about 10 nm and a first oxide semiconductor film having a thickness of about 25 nm were successively deposited over the silicon substrate. The first oxide film was deposited by a sputtering method using a polycrystalline sputtering target having an atomic ratio of In:Ga:Zn=1:3:2. The deposition of the first oxide semiconductor film was performed in a manner similar to that described above.

Next, phosphorus was implanted to the first oxide semiconductor film by an ion implantation method. The conditions of the implantation of phosphorus were as follows: the accelerating voltage was 10 kV; and the dosage of phosphorus was $1\times10^{14}$ cm$^{-2}$.

Next, a second oxide semiconductor film having a thickness of about 10 nm and a second oxide film having a thickness of about 10 nm were successively deposited. The second oxide semiconductor film is deposited in a manner similar to that of the first oxide semiconductor film, and the second oxide film is deposited in a manner similar to that of the first oxide film.
[Evaluation Using UPS]
An energy difference between the vacuum level and the top of the valence band (the energy difference is also referred to as an ionization potential) in the formed sample was measured using UPS. In the measurement, distribution of the ionization potential in the depth direction was examined while the sample was etched from its surface by a sputtering method.

Figure 22:
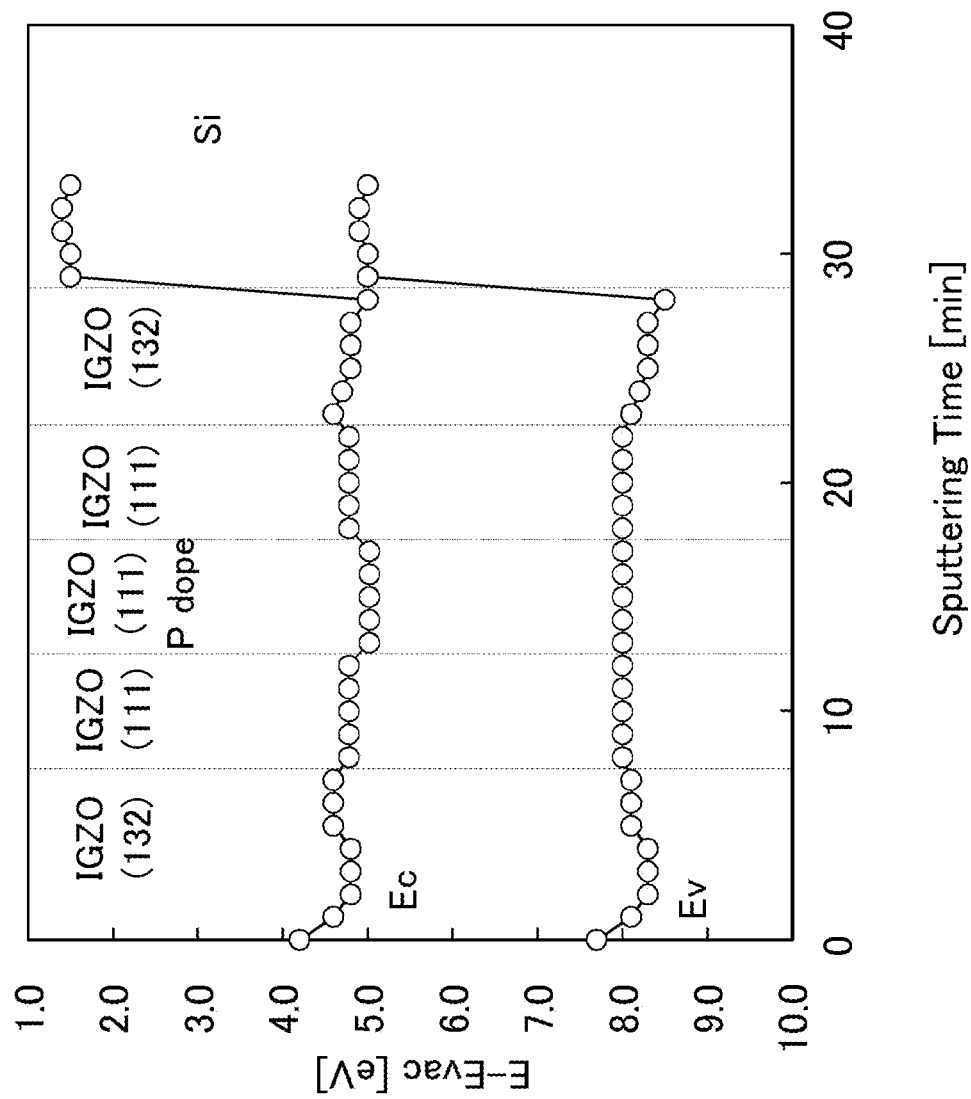
FIG. 22 shows the band structure of an example.

FIG. 22 shows an energy difference (Ev) between the vacuum level and the top of the valence band versus the sputtering time, which is obtained by UPS. Dashed lines in FIG. 22 each denote the interface between films estimated from the value of Ev.

Further, FIG. 22 shows an energy difference (Ec) between the vacuum level and the bottom of the conduction band, which is calculated using the above described Ev and value of the band gap obtained by ellipsometry. Here, the band gap of a film deposited using a polycrystalline sputtering target having an atomic ratio of In:Ga:Zn=1:1:1 (the film is represented as IGZO(111)) was 3.22 eV, and the band gap of a film deposited using a polycrystalline sputtering target having an atomic ratio of In:Ga:Zn=1:3:2 (the film is represented as IGZO(132)) was 3.50 eV.

As shown in FIG. 22, the energy difference (Ev) between the vacuum level and the top of the valence band in IGZO (111), which is obtained by UPS, was a substantially constant value (about 8.0 eV) regardless of whether doping of phosphorus was performed.

Further, as shown in FIG. 22, IGZO(132) had the smallest energy difference (Ec) between the vacuum level and the bottom of the conduction band and IGZO(111) had the secondary smallest energy difference (Ec), and the IGZO(111) to which phosphorus was implanted had the largest energy difference (Ec). A difference in energy of the bottom of the conduction band between IGZO(132) and IGZO(111) was about 0.28 eV, and a difference in energy of the bottom of the conduction band between IGZO(111) and IGZO(111) to which phosphorus was implanted was about 0.24 eV.

The above results indicate that the oxide stack of one embodiment of the present invention has two-stage wells.

Note that at least part of this example can be implemented in combination with any of the embodiments described in this specification as appropriate.

This application is based on Japanese Patent Application serial no. 2013-025088 filed with Japan Patent Office on Feb. 13, 2013, the entire contents of which are hereby incorporated by reference.

What is claimed is:

1. A semiconductor device comprising:
   an oxide stack in which a first oxide layer, a first oxide semiconductor layer, a second oxide semiconductor layer, and a second oxide layer are stacked sequentially over a substrate;
   a first electrode and a second electrode that are in contact with part of a bottom surface of the second oxide layer and separated from each other;
   a gate insulating layer over the second oxide layer; and
   a gate electrode over the gate insulating layer to overlap the oxide stack;
   wherein the first oxide semiconductor layer includes a first region and a second region,
   wherein a side portion and a bottom portion of the second region are in contact with the first region, and a top portion of the second region is in contact with the second oxide semiconductor layer,
   wherein the second region and the first electrode overlap each other and the second region and the second electrode do not overlap each other, and
   wherein the second region has a higher concentration of an element imparting conductivity to the first oxide semiconductor layer than the first region.

2. The semiconductor device according to claim 1,
   wherein the element is any of phosphorus, arsenic, antimony, boron, aluminum, nitrogen, argon, helium, neon, indium, fluorine, chlorine, hydrogen, titanium, and zinc.

3. The semiconductor device according to claim 1,
   wherein the first oxide layer, the second oxide layer, the first oxide semiconductor layer, and the second oxide semiconductor layer are each an In-M-Zn oxide (M is one of Al, Ti, Ga, Y, Zr, La, Ce, Nd, and Hf),
   wherein the first oxide layer has a higher content of the element M than the first oxide semiconductor layer, and
   wherein the second oxide layer has a higher content of the element M than the second oxide semiconductor layer.

4. The semiconductor device according to claim 1,
   wherein the gate electrode overlaps the first electrode and does not overlap the second electrode.

5. The semiconductor device according to claim 4,
   wherein the gate electrode is closer to the second electrode than the second region.

6. The semiconductor device according to claim 1,
   wherein a thickness of the second oxide semiconductor layer in a region that overlaps the first electrode is greater than or equal to 10 nm and less than or equal to 40 nm.

7. The semiconductor device according to claim 1,
   wherein at least one of the first oxide semiconductor layer and the second oxide semiconductor layer includes a crystal part.

8. A semiconductor device comprising:
   an oxide stack in which a first oxide layer, a first oxide semiconductor layer, a second oxide semiconductor layer, and a second oxide layer are stacked sequentially over a substrate;
   a first electrode and a second electrode that are in contact with part of the second oxide semiconductor layer and part of a bottom surface of the second oxide layer, and separated from each other;
   a gate insulating layer over the second oxide layer; and
   a gate electrode over the gate insulating layer to overlap the oxide stack;
   wherein the first oxide semiconductor layer includes a first region and a second region,
   wherein a side portion and a bottom portion of the second region are in contact with the first region, and a top portion of the second region is in contact with the second oxide semiconductor layer,
   wherein the second region and the first electrode overlap each other and the second region and the second electrode do not overlap each other, and
   wherein the second region has a higher concentration of an element imparting conductivity to the first oxide semiconductor layer than the first region.

9. The semiconductor device according to claim 8,
   wherein the element is any of phosphorus, arsenic, antimony, boron, aluminum, nitrogen, argon, helium, neon, indium, fluorine, chlorine, hydrogen, titanium, and zinc.

10. The semiconductor device according to claim 8,
    wherein the first oxide layer, the second oxide layer, the first oxide semiconductor layer, and the second oxide semiconductor layer are each an In-M-Zn oxide (M is one of Al, Ti, Ga, Y, Zr, La, Ce, Nd, and Hf),
    wherein the first oxide layer has a higher content of the element M than the first oxide semiconductor layer, and
    wherein the second oxide layer has a higher content of the element M than the second oxide semiconductor layer.

11. The semiconductor device according to claim 8,
    wherein the gate electrode overlaps the first electrode and does not overlap the second electrode.

12. The semiconductor device according to claim 11,
    wherein the gate electrode is closer to the second electrode than the second region.

13. The semiconductor device according to claim 8,
    wherein a thickness of the second oxide semiconductor layer in a region that overlaps the first electrode is greater than or equal to 10 nm and less than or equal to 40 nm.

14. The semiconductor device according to claim 8,
    wherein at least one of the first oxide semiconductor layer and the second oxide semiconductor layer includes a crystal part.

* * * * *